United States Patent
Sato

(10) Patent No.: US 8,159,004 B2
(45) Date of Patent: Apr. 17, 2012

(54) COMPOUND SEMICONDUCTOR DEVICE HAVING DOPANT CONCENTRATION GRADIENT

(75) Inventor: Ken Sato, Niiza (JP)

(73) Assignee: Sanken Electric Co., Ltd., Niiza-shi (JP)

( * ) Notice: Subject to any disclaimer, the term of this patent is extended or adjusted under 35 U.S.C. 154(b) by 62 days.

(21) Appl. No.: 12/544,589

(22) Filed: Aug. 20, 2009

(65) Prior Publication Data

US 2010/0052015 A1    Mar. 4, 2010

(30) Foreign Application Priority Data

Aug. 26, 2008 (JP) .................. 2008-216779
Aug. 28, 2008 (JP) .................. 2008-220390

(51) Int. Cl.
*H01L 29/778* (2006.01)
(52) U.S. Cl. ............ 257/194; 257/192; 257/12; 257/22; 257/94
(58) Field of Classification Search .................. 257/194, 257/199, 281, 284, 285, 472, 183
See application file for complete search history.

(56) References Cited

U.S. PATENT DOCUMENTS

| | | | | |
|---|---|---|---|---|
| 5,313,093 | A * | 5/1994 | Nakagawa | 257/194 |
| 5,323,020 | A * | 6/1994 | Mohammad et al. | 257/19 |
| 7,038,253 | B2 | 5/2006 | Yoshida et al. | |
| 7,417,258 | B2 * | 8/2008 | Hooper et al. | 257/86 |
| 2003/0098462 | A1 * | 5/2003 | Yoshida | 257/183 |
| 2007/0295993 | A1 * | 12/2007 | Chen et al. | 257/194 |
| 2009/0001423 | A1 * | 1/2009 | Mishima et al. | 257/194 |
| 2009/0200576 | A1 * | 8/2009 | Saito et al. | 257/194 |

FOREIGN PATENT DOCUMENTS

WO    WO 03/071607 A1    8/2003

* cited by examiner

*Primary Examiner* — Wai Sing Louie
*Assistant Examiner* — Bilkis Jahan
(74) *Attorney, Agent, or Firm* — Oblon, Spivak, McClelland, Maier & Neustadt, L.L.P.

(57) ABSTRACT

A semiconductor device includes a first compound semiconductor layer having a two-dimensional carrier gas channel, a second compound semiconductor layer which functions as a barrier layer and is arranged above the first compound semiconductor layer, a first main electrode connected to one end of the two-dimensional carrier gas channel, and a second main electrode connected to another end of the two-dimensional carrier gas channel, these ends being separated, wherein a compound ratio of an elemental compound of the second compound semiconductor layer is different in a direction of the two-dimensional carrier gas channel between the first main electrode and the second main electrode.

9 Claims, 14 Drawing Sheets

COMPOUND SEMICONDUCTOR DEVICE HAVING DOPANT CONCENTRATION GRADIENT

CROSS REFERENCE TO RELATED APPLICATION

This application is based upon and claims the benefit of priority from the prior Japanese Patent Application No. 2008-216.779 filed on Aug. 26, 2008 and Japanese Patent Application No. 2008-220.390 filed on Aug. 28, 2008, the entire contents of which are incorporated herein by reference.

BACKGROUND OF THE INVENTION

1. Field of the Invention

This invention relates to a semiconductor device, and more particularly relates to a semiconductor which has a compound semiconductor functional layer.

2. Description of the Related Art

A high electron mobility transistor (HEMT) is known as an electrical device which uses a gallium nitride (GaN) compound semiconductor. HEMT has a high electron (carrier) mobility rate and excellent high frequency properties. HEMT is comprised of a nitride semiconductor functional layer having a GaN layer which functions as a channel layer, and an aluminum nitride (AlGaN) layer which functions as a barrier layer stacked on this GaN layer by a hetero-junction. A two-dimensional electron gas channel (2DEG) in which high mobility electrons travel is produced close to the hetero-junction of the GaN layer. A source electrode and drain electrode are connected to the two-dimensional gas channel and a gate electrode is arranged between the source electrode and drain electrode. In a HEMT which has this type of structure, it is possible to realize a high carrier density via a piezoelectric field using spontaneous polarization and a lattice mismatch.

Furthermore, a HEMT is described in Laid Open Patent WO 03/071607 A1.

However, in the HEMT no concern was given to modulating the high carrier density or electric field within the two-dimensional electron gas channel in the channel direction, that is, carrier travel direction.

SUMMARY OF THE INVENTION

The present invention solves the above stated problems. Therefore, in the present invention, by changing the elemental ratio of an elemental compound between the main electrodes in a barrier layer it is possible to provide a semiconductor device in which carrier density and an electric field in a two-dimensional carrier gas channel which is produced in a compound semiconductor functional layer can be modulated in the travel direction of the carriers.

Furthermore, in the present invention it is possible to provide a semiconductor device in which carrier density and an electric field in a two-dimensional carrier gas channel which is produced in a compound semiconductor functional layer can be modulated in the travel direction of the carriers by changing the dopant density between the main electrodes of a barrier layer.

According to a first feature of the embodiment of the invention, a semiconductor device includes a first compound semiconductor layer having a two-dimensional carrier gas channel, a second compound semiconductor layer which functions as a barrier layer and is arranged above the first compound semiconductor layer, a first main electrode connected to one end of the two-dimensional carrier gas channel, and a second main electrode connected to another end of the two-dimensional carrier gas channel, these ends being separated, wherein a compound ratio of an elemental compound of the second compound semiconductor layer is different in a direction of the two-dimensional carrier gas channel between the first main electrode and the second main electrode.

In the first feature, the semiconductor device is provided wherein both the first compound semiconductor layer or the second compound semiconductor layer are compound semiconductor layers including nitride and the two-dimensional carrier gas channel is a two-dimensional electron gas channel.

In the first feature, the semiconductor device is provided wherein a compound ratio of an elemental compound of the second compound semiconductor layer is continuously different in the direction of the two-dimensional carrier gas channel.

In the first feature, the semiconductor device is provided wherein a compound ratio of an elemental compound of the second compound semiconductor layer is different in steps in the direction of the two-dimensional carrier gas channel.

According to a second feature of the embodiment of the invention, the semiconductor device is provided wherein the first main electrode is a source electrode connected to one end of the two-dimensional carrier gas channel, the second main electrode is a drain electrode connected to another end of two-dimensional carrier gas channel, these ends being separated, and further including a gate electrode arranged between the source electrode and the drain electrode above the two-dimensional carrier gas channel, and wherein a compound ratio of an elemental compound between the source electrode and the gate electrode of the second semiconductor layer is larger than a compound ratio of an elemental compound between the drain electrode and the gate electrode of the second semiconductor layer.

According to a third feature of the embodiment of the invention, the semiconductor device is provided wherein the first main electrode is a source electrode connected to one end of the two-dimensional carrier gas channel, the second main electrode is a drain electrode connected to another end of two-dimensional carrier gas channel, these ends being separated, and further including, a gate electrode arranged between the source electrode and the drain electrode above the two-dimensional carrier gas channel, and wherein a compound ratio of an elemental compound between the source electrode and the gate electrode of the second semiconductor layer is larger than a compound ratio of an elemental compound between the drain electrode and the gate electrode of the second semiconductor layer.

According to a fourth feature of the embodiment of the invention, a semiconductor device includes a first compound semiconductor layer having a two-dimensional carrier gas channel, a second compound semiconductor layer which functions as a barrier layer and is arranged above the first compound semiconductor layer, an anode electrode connected to one end of the two-dimensional carrier gas channel, and a cathode electrode connected to another end of the two-dimensional carrier gas channel, these ends being separated, wherein a compound ratio of an elemental compound of the anode electrode being larger than a compound ratio of an elemental compound of the cathode electrode between the anode electrode and the cathode electrode of the second compound semiconductor layer.

According to a fifth feature of the embodiment of the invention, a semiconductor device includes a first compound semiconductor layer having a two-dimensional carrier gas channel, a second compound semiconductor layer which functions as a barrier layer and is arranged above the first compound semiconductor layer, an anode electrode connected to one end of the two-dimensional carrier gas channel, and a cathode electrode connected to another end of the two-dimensional carrier gas channel, these ends being separated, wherein a compound ratio of an elemental compound of the cathode electrode being larger than a compound ratio of an elemental compound of the anode electrode between the anode electrode and the cathode electrode of the second compound semiconductor layer.

According to a sixth feature of the embodiment of the invention, a semiconductor device includes a first compound semiconductor layer having a two-dimensional carrier gas channel, a second compound semiconductor layer which functions as a barrier layer and is arranged above the first compound semiconductor layer, a first main electrode connected to one end of the two-dimensional carrier gas channel, and a second main electrode connected to another end of the two-dimensional carrier gas channel, these ends being separated, wherein a dopant concentration of the second compound semiconductor layer is different in a direction of the two-dimensional carrier gas channel between the first main electrode and the second main electrode.

In the sixth feature, the semiconductor device is provided wherein the dopant concentration of the second compound semiconductor layer is continuously different in a direction of the two-dimensional carrier gas channel.

In the sixth feature, the semiconductor device is provided wherein the dopant concentration of the second compound semiconductor layer is different in steps in a direction of the two-dimensional carrier gas channel.

In the sixth feature, the semiconductor device is provided wherein the first compound semiconductor layer is an n type doped nitride based semiconductor layer having n type dopants, the second compound semiconductor layer is a nitride based semiconductor layer, and the two-dimensional carrier gas channel is a two-dimensional electron gas channel.

In the sixth feature, the semiconductor device is provided wherein one or either an undoped layer or a spacer layer is arranged between the first compound semiconductor layer and the second compound semiconductor layer.

According to a seventh feature of the embodiment of the invention, the semiconductor device is provided device wherein the first main electrode is a source electrode connected to one end of the two-dimensional carrier gas channel, the second main electrode is a drain electrode connected to another end of the two-dimensional carrier gas channel, these ends being separated, and further including a gate electrode arranged between the source electrode and the drain electrode above the two-dimensional carrier gas channel, and wherein the dopant concentration between the source electrode and the gate electrode of the second semiconductor layer is lower than the dopant concentration between the source electrode and the gate electrode of the second semiconductor layer.

According to an eighth feature of the embodiment of the invention, the semiconductor device is provided wherein the first main electrode is a source electrode connected to one end of the two-dimensional carrier gas channel, the second main electrode is a drain electrode connected to another end of the two-dimensional carrier gas channel, these ends being separated, and further including a gate electrode arranged between the source electrode and the drain electrode above the two-dimensional carrier gas channel, and wherein the dopant concentration between the drain electrode and the gate electrode of the second semiconductor layer is higher than the dopant concentration between the source electrode and the gate electrode of the second semiconductor layer.

According to a ninth feature of the embodiment of the invention, a semiconductor device includes a first compound semiconductor layer having a two-dimensional carrier gas channel, a second compound semiconductor layer having a dopant and which functions as a barrier layer and is arranged above the first compound semiconductor layer, an anode electrode connected to one end of the two-dimensional carrier gas channel, and a cathode electrode connected to another end of the two-dimensional carrier gas channel, these ends being separated, wherein a dopant concentration of the anode electrode side being lower than a dopant concentration of the cathode electrode side between the anode electrode and the cathode electrode of the second compound semiconductor layer.

According to a tenth feature of the embodiment of the invention, a semiconductor device includes a first compound semiconductor layer having a two-dimensional carrier gas channel, a second compound semiconductor layer having a dopant and which functions as a barrier layer and is arranged above the first compound semiconductor layer, an anode electrode connected to one end of the two-dimensional carrier gas channel, and a cathode electrode connected to another end of the two-dimensional carrier gas channel, these ends being separated, wherein a dopant concentration of the anode electrode side being higher than a dopant concentration of the cathode electrode side between the anode electrode and the cathode electrode of the second compound semiconductor layer.

DETAILED DESCRIPTION OF THE INVENTION

Figure 1:
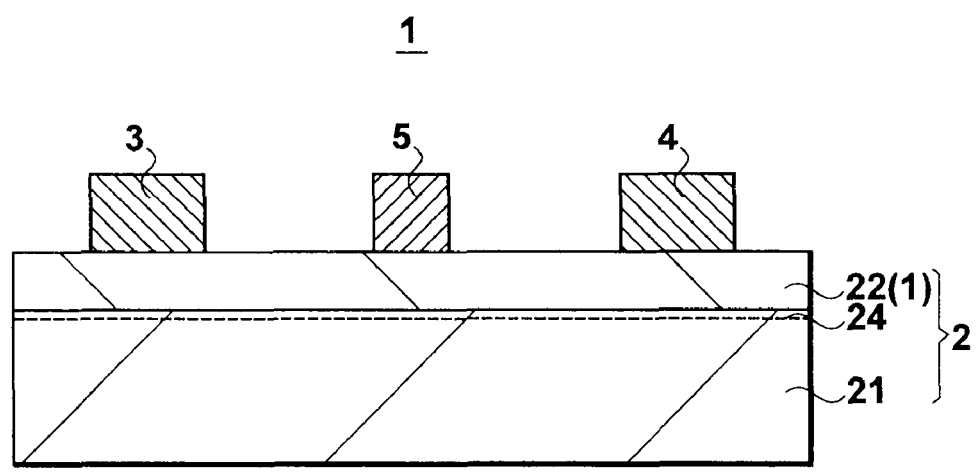
FIG. 1 is a cross sectional view of a semiconductor device according to a first embodiment of the invention.

The invention will be described with reference to the attached drawings. Like or corresponding parts are denoted by like or corresponding reference numerals. The drawings are schematic, and may sometimes differ from actual components. Further, dimensions and ratios of components may be different between drawings.

While the invention herein is disclosed by means of specific embodiments and applications thereof, numerous modifications and variations could be made thereto without departing from the scope of the invention set forth in the claims.

First Embodiment

The first embodiment of the present invention applies the present invention in a HEMT, which is a three terminal device, as a semiconductor device and explains reducing the generation of a current collapse in this HEMT and an example in which breakdown resistivity is improved.

[Structure of the HEMT]

As is shown in FIG. 1, the HEMT (semiconductor device) related to the first embodiment is arranged with a first compound semiconductor layer 21 which includes a two-dimensional carrier gas channel (channel region) 24, a second compound semiconductor layer 22 (1) which functions as a carrier generation region (barrier region) and is arranged on first compound semiconductor layer 21 by a hetero-junction, a first main electrode 3 connected to one end of a two-dimensional carrier gas channel 24, and a second main electrode 4 connected to the other end of the two-dimensional carrier gas channel 24 which is separated from the first end. Between the first main electrode 3 and the second main electrode 4, the elemental ratio of an element compound of the second compound semiconductor layer 22 (1) is different in the direction of the two-dimensional carrier gas channel 24.

The first compound semiconductor layer 21 and the second compound semiconductor layer 22 (1) form a compound semiconductor functional layer 2 and a HEMT 1 is formed in this compound semiconductor functional layer 2. In the first embodiment, although not shown in the diagram, the compound semiconductor functional layer 2 is formed directly on a substrate such as a silicon substrate, silicon carbide substrate or sapphire substrate or indirectly via buffer layer for matching the crystalline of the compound semiconductor functional layer 2. The lattice constant is smaller in the compound semiconductor layer 22 (1) of the compound semiconductor functional layer 2 than in the first compound semiconductor layer 21 and the band-gap is larger. Therefore, the second compound semiconductor layer 22(1) which is lattice matched to the first compound semiconductor layer 21 receives a tension stress.

Here, the compound semiconductor functional layer 2 is formed by a group III nitride based compound semiconductor material. A typical group III nitride based compound semiconductor is expressed as $Al_xIn_yGa_{1-x-y}N$ ($0 \leq x \leq 1$, $0 \leq y \leq 1$, or $0 \leq x+y \leq 1$).

Further, in the first embodiment, the Al (aluminum) compound ratio x 1 of the first compound semiconductor layer 21 of the compound semiconductor functional layer 2 has a range of $<x1<1$, and the Al compound ratio of the second compound semiconductor layer 22 (1) has a range of $\leq x2<1$, and when there is relationship where the compound ratio x2 is larger compared to the compound ratio x1 (x1<x2), the first compound semiconductor layer 21 is formed by a nitride semiconductor material expressed by $Al_{x1}Ga_{1-x1}N$, and the second compound semiconductor layer 22 (1) is formed by a nitride semiconductor material expressed by $Al_{x2}Ga_{1-x2}N$. That is, the compound semiconductor functional layer 2 is formed by a stacked structure of the first compound semiconductor layer 21 formed from AlGaN and the second compound semiconductor layer 22 (1) formed from AlGaN or a stacked structure of the first compound semiconductor layer 21 formed from GaN and the second compound semiconductor layer 22 (1) formed from AlGaN.

In the first embodiment, the thickness of the first compound semiconductor layer 21 is set at 0.5 μm to 10.0 μm, for example, and in the case of GaN the thickness is set at 0.5 μm to 3.5 μm. The thickness of the second compound semiconductor layer 22 (1) if set at 10 nm to 30 nm for example.

In the compound semiconductor functional layer 2, a two-dimensional carrier gas channel 24 (two-dimensional electron gas layer or two-dimensional hole gas layer) is produced at the surface part of the first compound semiconductor layer 21 which is near the hetero-junction interface surface between the first compound semiconductor layer 21 and the second compound semiconductor 22 (1) based on spontaneous polarization and a piezoelectric field of the first compound semiconductor layer 21 and the second compound semiconductor layer 22 (1). Here, the two-dimensional carrier gas channel 24 functions as an electron (carrier) channel having a high mobility in the HEMT 1.

In the first embodiment, the first main electrode 3 functions as a source electrode and the second main electrode 4 functions as a drain electrode. The first main electrode 3 and the second main electrode 4 are ohmic electrodes with a low resistance connected to the two-dimensional carrier gas channel 24. A voltage higher than a voltage applied to the first main electrode 3 is applied to the second main electrode 4, and when the gate electrode 5 is in an ON state, a current flows from the second main electrode 4 to the first main electrode 3 (electrons which are the carriers flow in reverse). In the first embodiment, the first main electrode 3 and the second main electrode 4 are formed by stacked layers of a Ti (titanium) layer having a thickness of 10 nm to 50 nm for example, and an Al layer having a thickness of 100 nm to 1000 nm for example, stacked on the Ti layer.

The gate electrode 5 is arranged above the second compound semiconductor layer 22 (1) and is connected to the two-dimensional carrier gas channel 24 via a schottky junction. The gate electrode 5 is formed by stacked layers of a Ni (Nickel) layer having a thickness of 100 nm to 500 nm for example, and an Au (gold) layer having a thickness of 0.1 μm to 1.0 μm for example, stacked on the Ni layer.

Furthermore, although not clearly shown in the FIG. 1 and diagrams thereafter, the dimensions between the first main electrode 3 and the gate electrode 5 are set smaller than the dimensions between the second main electrode 4 and the gate electrode 5 due to the resistance relationship.

Figure 2:
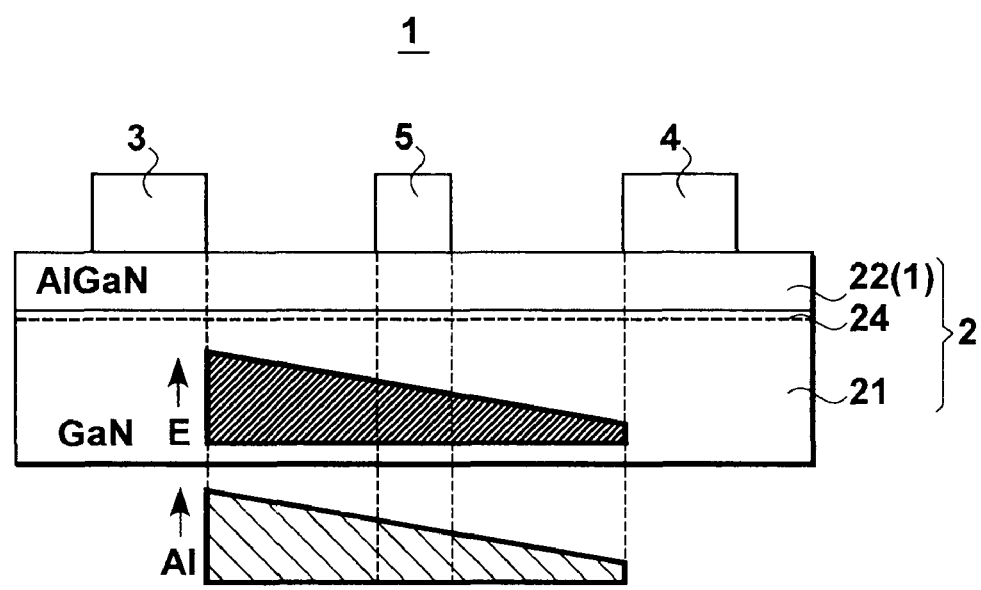
FIG. 2 is an exemplary cross sectional view for explaining the state of an electric field distribution and a compound profile of an element compound of the semiconductor device shown in FIG. 1.

In the HEMT 1 formed in this way, as is shown in FIG. 2, the compound ratio $x2$ of Al which is the elemental compound affecting the electric field strength E generated by spontaneous polarization and a piezoelectric field of the second compound semiconductor layer 22 (1) of the compound semiconductor functional layer 2 is set higher at the first main electrode 3 side between the first main electrode 3 and the second main electrode 4, continuously decreases from the first main electrode 3 side towards the second main electrode 4 side and is set low at the second main electrode 4 side. In other words, the compound ratio $x2$ of Al is continuously different in the direction of the two-dimensional carrier gas channel 24.

When the compound ratio $x2$ of Al increases, the band-gap of the second compound semiconductor layer 22 (1) widens, the carriers increase, the piezoelectric field becomes stronger (deformations become larger) and the electric field E becomes stronger. Reversely, when the compound ratio $x2$ of Al decreases, the piezoelectric field becomes weaker (deformations become smaller) and the electric filed E becomes weaker. When the compound ratio $x2$ of Al exceeds 0.5, it is difficult to form the second compound semiconductor 22 (1) which functions as a buffer layer. In addition, if the compound ratio $x2$ of Al does not reach 0.1, the ON resistance of the HEMT 1 becomes high. Therefore, it is preferred that the compound ratio $x2$ of Al be continuously altered within this range ($x2$=0.1 to 0.5).

[Operation Principles of the HEMT]

As is shown in FIG. 2, in the HEMT 1 related to the first embodiment stated above, the compound ratio $x2$ of Al which is the elemental compound of the second compound semiconductor layer 22 (1), is set high at the first main electrode 3 side, decreases continuously from the first main electrode 3 side towards the second main electrode 4 side in the direction of the two-dimensional carrier gas channel 24, and is set low at the second main electrode 4 side. That is, the compound ratio $x2$ of Al of the second compound semiconductor 22 (1) is different between the first main electrode 3 side and the second main electrode 4 side and asymmetrical. Therefore, distortions in the second compound semiconductor layer 22 (1), the electrical field strength E generated by spontaneous polarization and a piezoelectric field, and the carrier density of the two-dimensional gas channel 24 are different in the HEMT 1. The carrier density of the two-dimensional gas channel 24 in the second main electrode 4 side of the second compound semiconductor layer 22 (1) becomes lower than the carrier density of the two-dimensional gas channel 24 in the first main electrode 3 side.

In addition, as is shown in FIG. 2, the electrical field strength E generated by spontaneous polarization and a piezoelectric field becomes lower at the second main electrode 4 side of the second compound semiconductor layer 22 (1) than the first main electrode 3 side. In other words, when a voltage is applied and the HEMT is in an ON state, conventionally, the electrical field strength at the second main electrode 4 side becomes larger so that the voltage of the second main electrode 4 becomes higher than the voltage of the first main electrode 3, however, the HEMT 1 related to the first embodiment can be controlled so that the electrical field strength E which is produced by spontaneous polarization and a piezoelectric field is reduced and the electrical field strength distribution made uniform. Therefore, because it is possible to reduce the generation of hot electrons near the second main electrode 4 (drain electrode), it is possible to reduce the generation of current collapse in the HEMT 1.

In addition, because it is possible to reduce the electrical field strength E generated at the second main electrode 4 side end of the gate electrode 5 compared to the electrical field strength E generated at the first main electrode 3 side end, it is possible to improve breakdown resistivity.

[Manufacturing Method of a HEMT]

Although the manufacturing method will not particularly be explained using the diagrams, the second compound semiconductor layer 22 (1) of the HEMT 1 stated above is formed using a MOCVD (metal organic chemical vapor deposition) method. For example, in a MOCVD device, it is possible to form the second compound semiconductor layer 22 (1) with a different compound ratio of Al using a method for supplying the flow ratio of trimethyl aluminum (TMA) at a slant above a substrate (wafer) which formed the first compound semiconductor layer 21 or a method which controls the substrate temperature at a slant. Here, the flow ratio of TMA or the substrate temperature is set high at the first main electrode 3 side and low at the second main electrode 4 side.

In addition, it is possible to introduce Al to the second compound semiconductor layer 22 (1) using a grayscale mask method or mask retreat method so that the compound ratio $x2$ is different in the direction of the two-dimensional carrier gas channel 24. It is possible to practically use an ion implantation method or solid phase diffusion method for example for introducing Al.

Characteristics of the First Embodiment

As explained above, in the HEMT 1 related to the first embodiment it is possible to modulate the carrier density and electrical field strength E of the two-dimensional carrier gas channel 24 which is produced in the compound semiconductor functional layer 2 in the travelling direction of the carriers. As a result, in the HEMT 1, it is possible to reduce the generation of hot electrons near the second main electrode 4 and reduce the generation of a breakdown current. In addition, in the HEMT 1, because the electrical field strength E of the gate electrode 5 end part is lowered, it is possible to improve breakdown resistivity.

First Transformation Example

The HEMT 1 related to the first transformation example of the first embodiment will be used to explain an example in which the nitride based semiconductor material of the compound semiconductor functional layer 2 is replaced.

The compound semiconductor functional layer 2 of the HEMT 1 related to the first transformation example is formed by a stacked layer structure of a first compound semiconductor layer 21 formed from InGaN and a second compound semiconductor layer 22 (1) formed from AlInN or a stacked layer structure of a first compound semiconductor layer 21 formed from GaN and a second compound semiconductor layer 22 (1) formed from AlInN.

A compound ratio y1 of In (indium) of the first compound semiconductor layer 21 has range of $0<y1<1$, and the first compound semiconductor layer 21 is a nitride based semiconductor material expressed by $In_yGa_{1-y1}N$. The compound ratio x2 of Al of the second compound semiconductor layer 22 (1) has a range of $\geq x2<1$ and the compound ratio y2 of In has a range of $0<y2<1$, and the second compound semiconductor layer 22 (1) is a nitride based semiconductor material expressed by $Al_{x2}In_{1-y2}N$.

In the HEMT 1 related to the first transformation example, the same as the HEMT 1 related to the first embodiment stated above, either the compound ratio x2 of Al which is the elemental compound affecting the electric field strength E generated by spontaneous polarization and a piezoelectric field of the second compound semiconductor layer 22 (1) of the compound semiconductor functional layer 2 or the compound ratio y2 of In is set high at the first main electrode 3 side between the first main electrode 3 and the second main electrode 4, continuously decreases from the first main electrode 3 side towards the second main electrode 4 side and is set low at the second main electrode 4 side. In other words, the compound ratio x2 of Al or the compound ratio y2 of In is continuously different in the direction of the two-dimensional carrier gas channel 24.

In the HEMT 1 related to the first transformation example formed in this way, it is possible to demonstrate the same effects as the operational effects obtained by the HEMT 1 related to the first embodiment.

Second Transformation Example

The HEMT 1 related to the second transformation example of the first embodiment will be used to explain an example in which the nitride based semiconductor material of the compound semiconductor functional layer 2 is replaced.

The compound semiconductor functional layer 2 of the HEMT 1 related to the second transformation example is formed by a stacked layer structure of a first compound semiconductor layer 21 formed from InGaN and a second compound semiconductor layer 22 (1) formed from AlGaN.

A compound ratio y1 of In of the first compound semiconductor layer 21 has range of $0<y1<1$, and the first compound semiconductor layer 21 is a nitride based semiconductor material expressed by $In_yGa_{1-y1}N$. The compound ratio x2 of Al of the second compound semiconductor layer 22 (1) has a range of $\geq x2<1$ and the compound ratio y2 of In has a range of $0<y2<1$, and the second compound semiconductor layer 22 (1) is a nitride based semiconductor material expressed by $Al_{x2}In_{1-y2}N$.

In the HEMT 1 related to the second transformation example, the same as the HEMT 1 related to the first embodiment stated above, the compound ratio x2 of Al which is the elemental compound affecting the electric field strength E generated by spontaneous polarization and a piezoelectric field of the second compound semiconductor layer 22 (1) of the compound semiconductor functional layer 2 is set high at the first main electrode 3 side between the first main electrode 3 and the second main electrode 4, continuously decreases from the first main electrode 3 side towards the second main electrode 4 side and is set low at the second main electrode 4 side. In other words, the compound ratio x2 of Al is continuously different in the direction of the two-dimensional carrier gas channel 24.

In the HEMT 1 related to the second transformation example formed in this way, it is possible to demonstrate the same effects as the operational effects obtained by the HEMT 1 related to the first embodiment.

Second Embodiment

In the second embodiment of the present invention, the present invention is applied to a HEMT as a semiconductor device and an example in which an increase in the carrier mobility of this HEMT is achieved.

[Structure of the HEMT]

Figure 3:
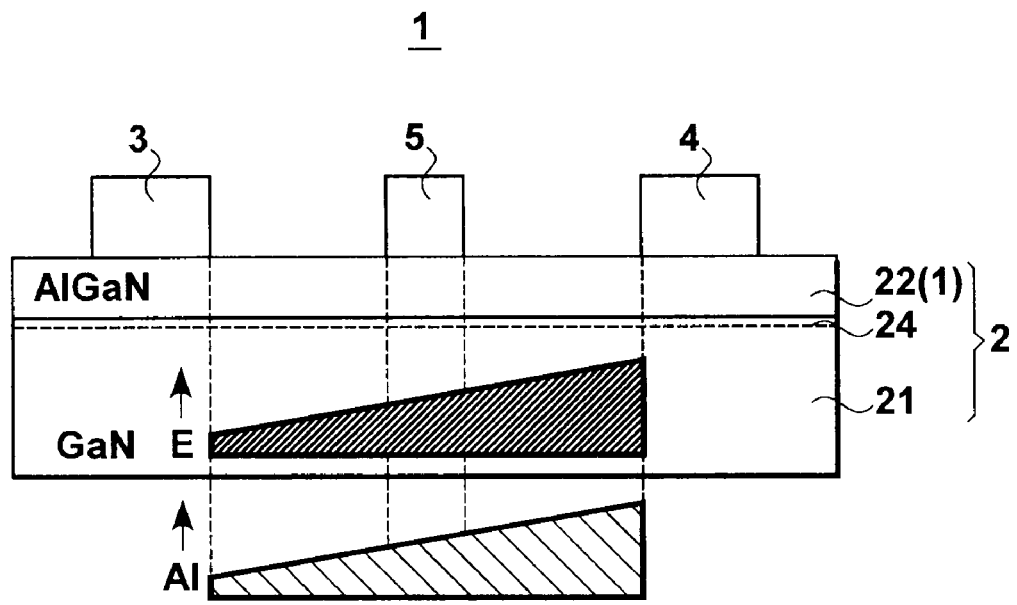
FIG. 3 is an exemplary cross sectional view for explaining the state of an electric field distribution and a compound profile of an element compound of a semiconductor device related to a second embodiment of the present invention.

As is shown in FIG. 3, the basic structure of the HEMT 1 (semiconductor device) related to the second embodiment is the same as the HEMT 1 related to the first embodiment, however, the compound ratio x2 of Al is set low at the first main electrode 3 side of the second compound semiconductor layer 22 (1), is continuously increased from the first main electrode 3 towards the second main electrode 4 and is set high at the second main electrode 4 side. In other words, in the HEMT 1 related to the second embodiment, the compound ratio of Al of the second compound semiconductor layer 22 (1) is different in the reverse direction to the direction of the two-dimensional carrier gas channel 24 in which the compound ratio of Al of the second compound semiconductor layer 22 (1) of the HEMT 1 related to the first embodiment is different.

[Operation Principles of the HEMT]

As is shown in FIG. 3, in the HEMT 1 related to the second embodiment stated above, the compound ratio x2 of Al which is the elemental compound of the second compound semiconductor layer 22 (1), is set low at the first main electrode 3 side, increases continuously from the first main electrode 3 side towards the second main electrode 4 side in the direction of the two-dimensional carrier gas channel 24, and is set high at the second main electrode 4 side. That is, the compound ratio x2 of Al of the second compound semiconductor 22 (1) is different between the first main electrode 3 side and the second main electrode 4 side and asymmetrical. Therefore, distortions in the second compound semiconductor layer 22 (1), the electrical field strength E generated by spontaneous polarization and a piezoelectric field, and the carrier density of the two-dimensional gas channel 24 are different in the HEMT 1. The carrier density of the two-dimensional gas channel 24 at the second main electrode 4 side of the second compound semiconductor layer 22 (1) becomes higher than the carrier density of the two-dimensional gas channel 24 in the first main electrode 3 side.

In addition, as is shown in FIG. 3, the electrical field strength E generated by spontaneous polarization and a piezoelectric field, becomes higher at the second main electrode 4 side of the second compound semiconductor layer 22 (1) than the first main electrode 3 side. In other words, it is possible to increase (modulate) the electrical strength E based on spontaneous polarization and a piezoelectric field in a reverse direction (travel direction of the carriers) to the electrical field direction from the second main electrode 4 towards the first main electrode 3. Therefore, in the HEMT 1, because it is possible to increase the speed of the carriers of the two-dimensional carrier gas channel 24 near the second main electrode 4 (drain electrode), it is possible to achieve an increase in switching speed.

Furthermore, because the manufacturing method of the HEMT 1 related to the second embodiment is the same as the manufacturing method related to the first embodiment stated above, here explanations which overlap will be omitted. In addition, in the HEMT 1 related to the second embodiment, it is possible to change the material of the stacked structure of the compound semiconductor functional layer 2 the same as the first transformation of HEMT 1 related to the first embodiment stated above and the second transformation example.

Characteristics of the Second Embodiment

As was explained above, in the HEMT 1 related to the second embodiment, it is possible to modulate the carrier density of the two-dimensional carrier gas channel 24 which is produced in the compound semiconductor functional layer 2 and electrical field strength E in the travel direction of the carriers. As a result, it is possible to increase the electrical field strength E near the second main electrode 4 and because it is possible to increase the speed of the carriers of the two-dimensional carrier gas channel 24 it is possible to achieve an increase in switching speed.

Third Embodiment

The third embodiment will explain an example in which breakdown resistivity is improved as well as realizing high speed of the carrier mobility of the HEMT by applying the present invention to the HEMT as a semiconductor device.
[Structure of the HEMT]

Figure 4:
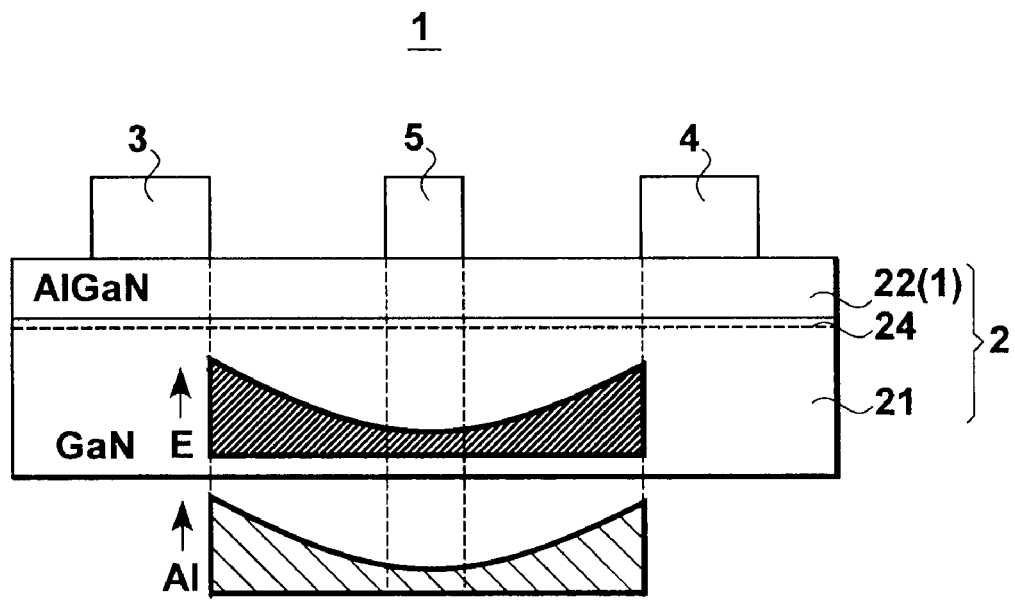
FIG. 4 is an exemplary cross sectional view for explaining the state of an electric field distribution and a compound profile of an element compound of a semiconductor device related to a third embodiment of the present invention.

As is shown in FIG. 4, the basic structure of the HEMT 1 (semiconductor device) related to the third embodiment is the same as the HEMT 1 related to the first embodiment, however, the compound ratio x2 of Al is set high at the first main electrode 3 side of the second compound semiconductor layer 22 (1), is continuously decreased from the first main electrode 3 towards the gate electrode 5, is set low at the gate electrode 5 part particularly the second main electrode 4 side end part, is continuously increased from the gate electrode 5 towards the second main electrode 4 and is again set high at the second main electrode 4 side. In other words, in the HEMT 1, the compound ratio of Al of the second compound semiconductor layer 22 (1) is set low in the region corresponding to the gate electrode 5 and is set high at the second main electrode 4 side.
[Operation Principles of the HEMT]

As is shown in FIG. 4, in the HEMT 1 related to the third embodiment stated above, the compound ratio x2 of Al which is the elemental compound of the second compound semiconductor layer 22 (1), is set high at the first main electrode 3 side, decreases continuously from the first main electrode 3 side towards the gate electrode 5 side in the direction of the two-dimensional carrier gas channel 24, and is set low at the region corresponding to the gate electrode 5. Then, the compound ratio x2 of Al of the second compound semiconductor layer 22 (1) is continuously increased from the gate electrode 5 side towards the second main electrode 4 side in the direction of the two-dimensional carrier gas channel 24. That is, the compound ratio x2 of Al of the second compound semi- conductor 22 (1) is different between the first main electrode 3 side and the second main electrode 4 side and the region corresponding to the gate electrode 5 and is almost symmetrical between the first main electrode 3 side and the second main electrode 4 side with the gate electrode 5 at as the center. Therefore, distortions in the second compound semiconductor layer 22 (1), the electrical field strength E generated by spontaneous polarization and a piezoelectric field, and the carrier density of the two-dimensional carrier gas channel 24 are different in the HEMT 1. The carrier density of the two-dimensional carrier gas channel 24 at the second main electrode 4 side of the second compound semiconductor layer 22 (1) becomes higher than the carrier density of the two-dimensional carrier gas channel 24 in the region corresponding to the gate electrode 5.

In addition, as is shown in FIG. 4, the electrical field strength E generated by spontaneous polarization and a piezoelectric field, becomes higher at the second main electrode 4 side of the second compound semiconductor layer 22 (1) than the region corresponding to the gate electrode 5. In other words, it is possible to increase (modulate) the electrical strength E based on spontaneous polarization and a piezoelectric field in a reverse direction (travel direction of the carriers) to the electrical field direction from the second main electrode 4 towards the first main electrode 3. Therefore, in the HEMT 1, because it is possible to increase the speed of the carriers of the two-dimensional carrier gas channel 24 near the second main electrode 4 (drain electrode), it is possible to achieve an increase in switching speed.

In addition, in the HEMT 1, because it is possible to reduce the electrical field strength E generated at the second main electrode 4 side end of the gate electrode 5 compared to the electrical field strength E generated at the second main electrode 4 side end, it is possible to improve breakdown resistivity.

Furthermore, because the manufacturing method of the HEMT 1 related to the third embodiment is the same as the manufacturing method related to the first embodiment stated above, here explanations which overlap will be omitted. In addition, in the HEMT 1 related to the third embodiment, it is possible to change the material of the stacked structure of the compound semiconductor functional layer 2 the same as the first transformation of HEMT 1 related to the first embodiment stated above and the second transformation example.

Characteristics of the Third Embodiment

As was explained above, in the HEMT 1 related to the third embodiment, it is possible to modulate the carrier density of the two-dimensional carrier gas channel 24 which is produced in the compound semiconductor functional layer 2 and electrical field strength E in the travel direction of the carriers. As a result, in the HEMT 1, it is possible to decrease the generation of hot electrons near the second main electrode 4 and reduce the generation of current collapse. In addition, in the HEMT 1, because it is possible to lower the electrical field strength E of the gate electrode 5 end part, it is possible to improve breakdown resistivity.

Fourth Embodiment

The fourth embodiment will explain an example in which the generation of current collapse of the HEMT is reduced by applying the present invention to the HEMT as a semiconductor device.

[Structure of the HEMT]

Figure 5:
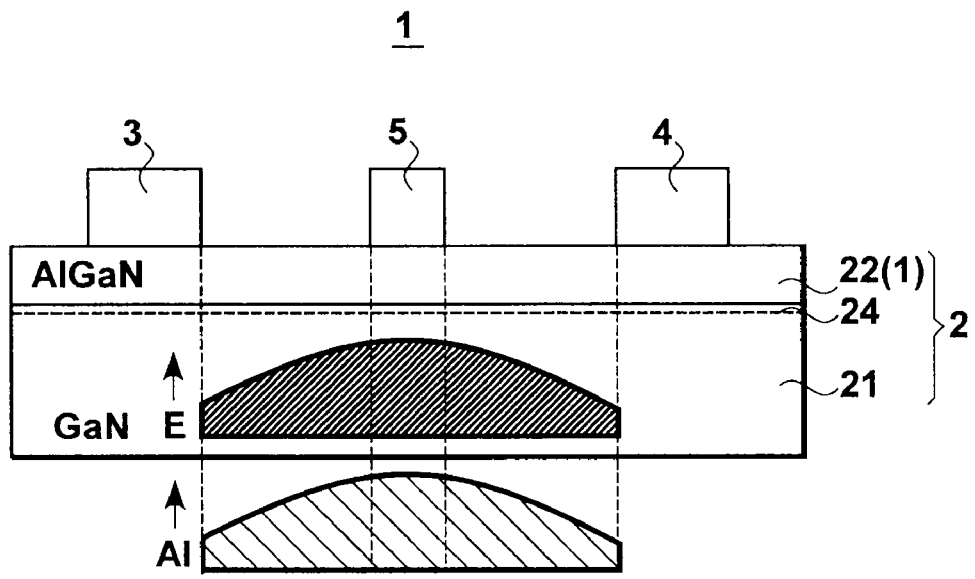
FIG. 5 is an exemplary cross sectional view for explaining the state of an electric field distribution and a compound profile of an element compound of a semiconductor device related to a fourth embodiment of the present invention.

As is shown in FIG. 5, the basic structure of the HEMT 1 (semiconductor device) related to the fourth embodiment is the same as the HEMT 1 related to the first embodiment, however, the compound ratio x2 of Al is set low at the first main electrode 3 side of the second compound semiconductor layer 22 (1), is continuously increased from the first main electrode 3 towards the gate electrode 5, is set high at the gate electrode 5 part, is continuously decreased from the gate electrode 5 towards the second main electrode 4 and is again set low at the second main electrode 4 side. In other words, in the HEMT 1, the compound ratio x2 of Al of the second compound semiconductor layer 22 (1) is set high in the region corresponding to the gate electrode 5 and is set low at the second main electrode 4 side.

[Operation Principles of the HEMT]

As is shown in FIG. 5, in the HEMT 1 related to the fourth embodiment stated above, the compound ratio x2 of Al which is the elemental compound of the second compound semiconductor layer 22 (1), is set low at the first main electrode 3 side, increases continuously from the first main electrode 3 side towards the gate electrode 5 side in the direction of the two-dimensional carrier gas channel 24, and is set high at the region corresponding to the gate electrode 5. Then, the compound ratio x2 of Al of the second compound semiconductor layer 22 (1) is continuously decreased from the gate electrode 5 side towards the second main electrode 4 side in the direction of the two-dimensional carrier gas channel 24 and set low at the second main electrode 4 side. That is, the compound ratio x2 of Al of the second compound semiconductor 22 (1) is different between the first main electrode 3 side and the second main electrode 4 side and the region corresponding to the gate electrode 5 and is almost symmetrical between the first main electrode 3 side and the second main electrode 4 side with the gate electrode 5 at as the center. Therefore, distortions in the second compound semiconductor layer 22 (1), the electrical field strength E generated by spontaneous polarization and a piezoelectric field, and the carrier density of the two-dimensional carrier gas channel 24 are different in the HEMT 1. The carrier density of the two-dimensional carrier gas channel 24 at the second main electrode 4 side of the second compound semiconductor layer 22 (1) becomes lower than the carrier density of the two-dimensional carrier gas channel 24 in the region corresponding to the gate electrode 5.

In addition, as is shown in FIG. 5, the electrical field strength E generated by spontaneous polarization and a piezoelectric field, becomes lower at the second main electrode 4 side of the second compound semiconductor layer 22 (1) than the region corresponding to the gate electrode 5. In other words, when a voltage is applied and the HEMT 1 is in an OFF state, conventionally, the electrical field strength at the second main electrode 4 side becomes larger so that the voltage of the second main electrode 4 becomes higher than the voltage of the first main electrode 3, however, the HEMT 1 related to the fourth embodiment can be controlled so that the electrical field strength E which is produced by spontaneous polarization and a piezoelectric field is reduced and the electrical field strength distribution made uniform. Therefore, because it is possible to reduce the generation of hot electrons near the second main electrode 4 (drain electrode), it is possible to reduce the generation of current collapse in the HEMT 1.

Furthermore, because the manufacturing method of the HEMT 1 related to the fourth embodiment is the same as the manufacturing method of the HEMT 1 related to the first embodiment stated above, here explanations which overlap will be omitted. In addition, in the HEMT 1 related to the fourth embodiment, it is possible to change the material of the stacked structure of the compound semiconductor functional layer 2 the same as the first transformation of HEMT 1 related to the first embodiment stated above and the second transformation example.

Characteristics of the Fourth Embodiment

As was explained above, in the HEMT 1 related to the fourth embodiment, it is possible to modulate the carrier density of the two-dimensional carrier gas channel 24 which is produced in the compound semiconductor functional layer 2 and electrical field strength E in the travel direction of the carriers. As a result, in the HEMT 1, it is possible to decrease the generation of hot electrons near the second main electrode 4 and reduce the generation of current collapse.

Fifth Embodiment

The fifth embodiment will explain an example in which the generation of current collapse of the HEMT is reduced by applying the present invention to the HEMT as a semiconductor device.

[Structure of the HEMT]

Figure 6:
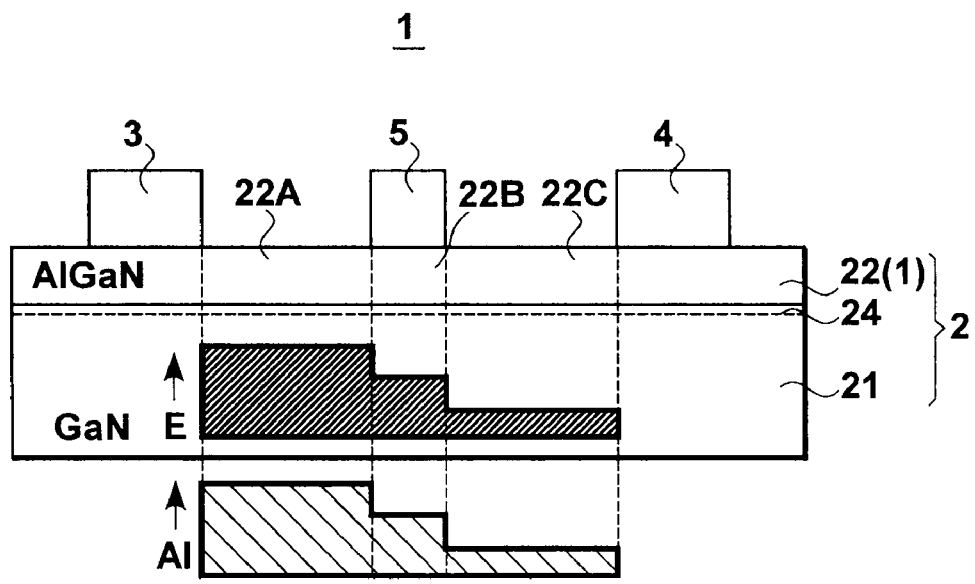
FIG. 6 is an exemplary cross sectional view for explaining the state of an electric field distribution and a compound profile of an element compound of a semiconductor device related to a fifth embodiment of the present invention.

As is shown in FIG. 6, the basic structure of the HEMT 1 (semiconductor device) related to the fifth embodiment is the same as the HEMT 1 related to the first embodiment, however, the compound ratio x2 of Al is set high at the first main electrode 3 side of the second compound semiconductor layer 22 (1), is decreased in steps from the first main electrode 3 towards the second main electrode 4, and is set low at the second main electrode 4 side. In the HEMT 1, the second compound semiconductor layer 22 (1), a first region 22A in which the compound ratio x2 of Al is set high is arranged at the first main electrode 3 side, a third region 22C in which the compound ratio x2 of Al is set low is arranged on the second main electrode 4 side, and a second region 22B in which the compound ratio x2 of Al is set between these the first and third regions, is arranged between the first region 22A and the third region 22C. Here, in steps means a region of a constant Al compound ratio which continues at certain intervals in the direction of the two-dimensional carrier gas channel 24 and then a different region of a constant Al compound ratio which continues at certain intervals in the direction of the two-dimensional carrier gas channel 24.

[Operation Principles of the HEMT]

As is shown in FIG. 6, in the HEMT 1 related to the fifth embodiment stated above, the compound ratio x2 of Al which is the elemental compound of the second compound semiconductor layer 22 (1), is set high at the first main electrode 3 side, decreases in steps from the first main electrode 3 side towards the second main electrode 4 side in the direction of the two-dimensional carrier gas channel 24, and is set low at the second main electrode 4 side. That is, the compound ratio x2 of Al of the second compound semiconductor 22 (1) is different between the first main electrode 3 side and the second main electrode 4 side and is asymmetrical. Therefore, distortions in the second compound semiconductor layer 22 (1), the electrical field strength E generated by spontaneous polarization and a piezoelectric field, and the carrier density of the two-dimensional carrier gas channel 24 are different in the HEMT 1. The carrier density of the two-dimensional carrier gas channel 24 at the second main electrode 4 side of the second compound semiconductor layer 22 (1) becomes lower than the carrier density of the two-dimensional carrier gas channel 24 in the region corresponding to the gate electrode 5.

In addition, as is shown in FIG. 6, the electrical field strength E generated by spontaneous polarization and a piezoelectric field, becomes lower at the second main electrode 4 side of the second compound semiconductor layer 22 (1) than the region corresponding to the first main electrode 3 side. In other words, when a voltage is applied and the HEMT 1 is in an OFF state, conventionally, the electrical field strength at the second main electrode 4 side becomes larger so that the voltage of the second main electrode 4 becomes higher than the voltage of the first main electrode 3, however, the HEMT 1 related to the fifth embodiment can be controlled so that the electrical field strength E which is produced by spontaneous polarization and a piezoelectric field is reduced and the electrical field strength distribution made uniform. Therefore, because it is possible to reduce the generation of hot electrons near the second main electrode 4 (drain electrode), it is possible to reduce the generation of current collapse in the HEMT 1.

[Manufacturing Method of the HEMT]

The manufacturing method of the HEMT 1 related to the fifth embodiment stated above is as follows.

Figure 7:
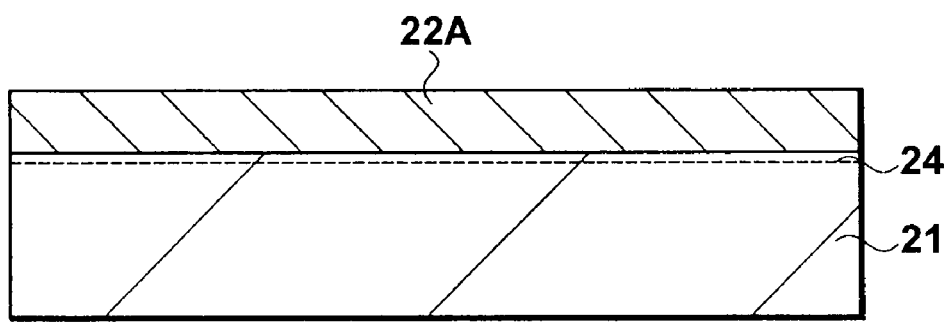
FIG. 7 is first process cross sectional view for explaining a manufacturing method of the semiconductor device related to the first embodiment.
Figure 8:
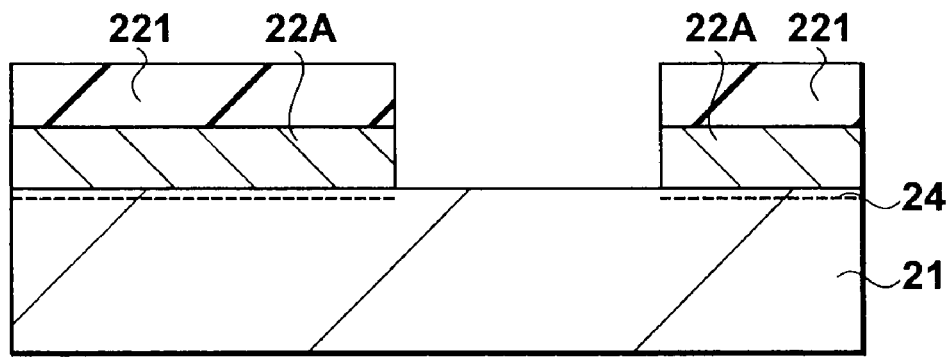
FIG. 8 is a second process cross sectional view.
Figure 9:
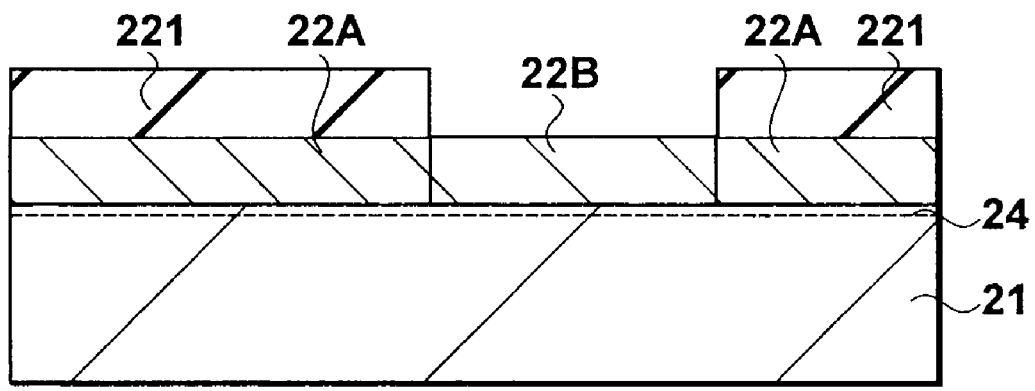
FIG. 9 is a third process cross sectional view.

First, as is shown in FIG. 7, the first region 22A of the second compound semiconductor layer 22 (1) is formed in a region in which at least the two-dimensional carrier gas channel 24 of the HEMT 1 above the first compound semiconductor layer 21. The first region 22A is a compound semiconductor layer in which the compound ratio of Al which is the elemental compound is high. The first region 22A is formed as a film by the MOCVD method and the compound ratio of Al is controlled by adjusting the flow ratio of TMA when forming this film. Above the first region 22A, a mask 221 is formed having an open region which forms the second region 22B and third region 22C. It is possible to use a silicon oxide film for example as the mask 221. As is shown in FIG. 8, the first region 22A which is exposed from this opening is removed by etching using the mask 221. Then, as is shown in FIG. 9, the second region 22B of the second compound semiconductor layer 22 (1) is formed above the first compound semiconductor layer 21 using the mask 221. The second region 22B is a compound semiconductor layer having a center compound ratio of Al which is the elemental compound. The second region 22B is formed as a film the same as the first region 22A by the MOCVD method for example, and the compound ratio of Al is controlled by adjusting the flow ratio of TMA when this film is formed. After this, the mask 221 is removed.

Figure 10:
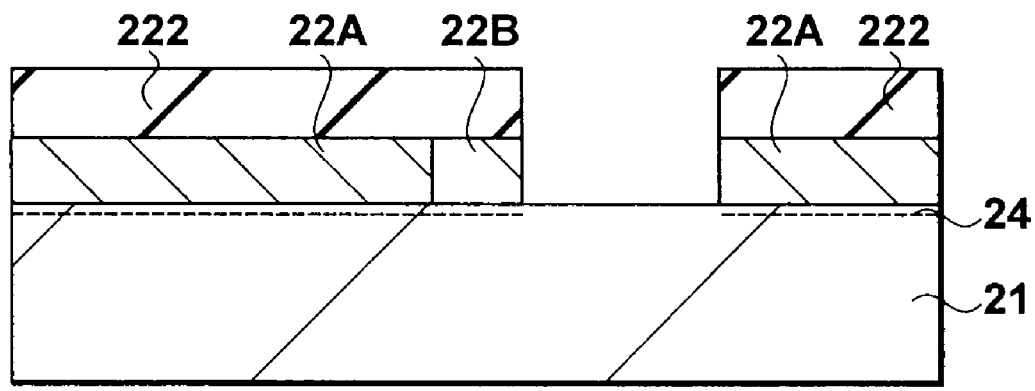
FIG. 10 is a fourth process cross sectional view.
Figure 11:
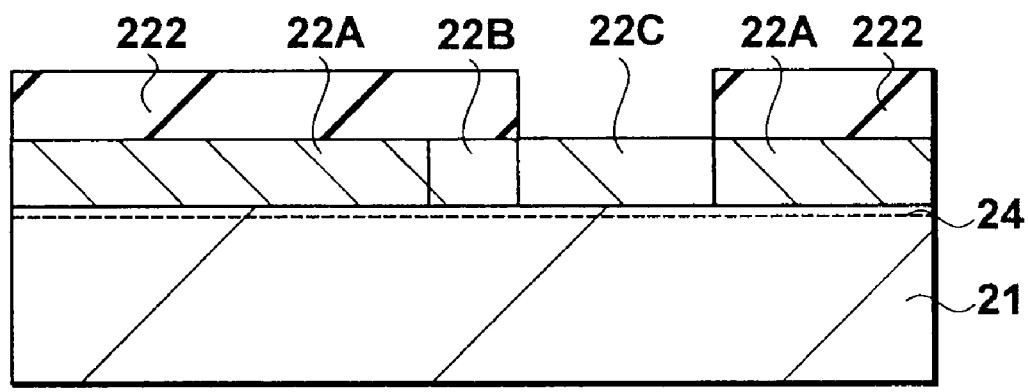
FIG. 11 is a fifth process cross sectional view.

A mask 222 having an open region which forms the third region 22C is formed above the first region 22A and the second region 22B. It is possible to use a silicon oxide film for example as the mask 222. As is shown in FIG. 10, the second region 22B which is exposed from this opening is removed by etching using the mask 222. Then, as is shown in FIG. 11, the third region 22C of the second compound semiconductor layer 22 (1) is formed above the first compound semiconductor layer 21 using the mask 222. The second region 22C is a compound semiconductor layer having a low compound ratio of Al which is the elemental compound. The third region 22C is formed as a film the same as the first region 22A and second region 22B by the MOCVD method for example, and the compound ratio of Al is controlled by adjusting the flow ratio of TMA when this film is formed. After this, the mask 222 is removed.

Furthermore, etching may be performed up to the first compound semiconductor layer 21 when the first region 22A and the second region 22B of the second compound semiconductor region 22 (1) are each removed by etching. In this case, as stated above, it is possible to prevent the generation of crystal defects near the hetero-junction interface surface.

In addition, the formation order of each of the first region 22A, second region 22B and third region 22C may be reversed, may be formed in the order second region 22B, first region 22A, third region 22C or in the order second region 22B, third region 22C, first region 22A.

Characteristics of the Fifth Embodiment

As was explained above, in the HEMT 1 related to the fifth embodiment, it is possible to modulate the carrier density of the two-dimensional carrier gas channel 24 which is produced in the compound semiconductor functional layer 2 and electrical field strength E in the travel direction of the carriers. As a result, in the HEMT 1, it is possible to decrease the generation of hot electrons near the second main electrode 4 and reduce the generation of current collapse.

Furthermore, it is possible to change the material of the stacked structure of the compound semiconductor functional layer 2 the same as the first transformation of HEMT 1 related to the first embodiment stated above and the second transformation example.

Transformation Example

In the HEMT 1 related to a transformation example of the fifth embodiment, in the HEMT 1 related to the fifth embodiment shown in FIG. 6 stated above, the compound ratio x2 of Al of the first region 22A which is arranged at the first main electrode 3 side of the second compound semiconductor layer 22 (1) of the compound semiconductor functional layer 2 is set low, the compound ratio x2 of Al of the third region 22C is set high and the compound ratio x2 of Al of the second region 22B is set between the ratios of the first and second regions. In other words, in the HEMT 1 related to the transformation example of the fifth embodiment, the compound ratio x2 of Al is set low at the first main electrode 3 side of the second compound semiconductor layer 22 (1), is increase in steps from the first main electrode 3 towards the second main electrode 4 and is set high at the second main electrode 4 side.

In the HEMT 1 related to the fifth embodiment formed in this way, it is possible to modulate the carrier density of the two-dimensional carrier gas channel 24 which is produced in the compound semiconductor functional layer 2 and electrical field strength E in the travel direction of the carriers. As a result, it is possible to increase the electrical field strength E near the second main electrode 4 and because it is possible to increase the speed of the carriers of the two-dimensional carrier gas channel 24 it is possible to achieve an increase in switching speed.

Sixth Embodiment

In the sixth embodiment of the present invention, the present invention is applied as a semiconductor to a Schottky barrier diode (SBD) which is a two terminal element and an example in which resistance of this SBD is improved is explained.

[Structure of the SBD]

Figure 12:
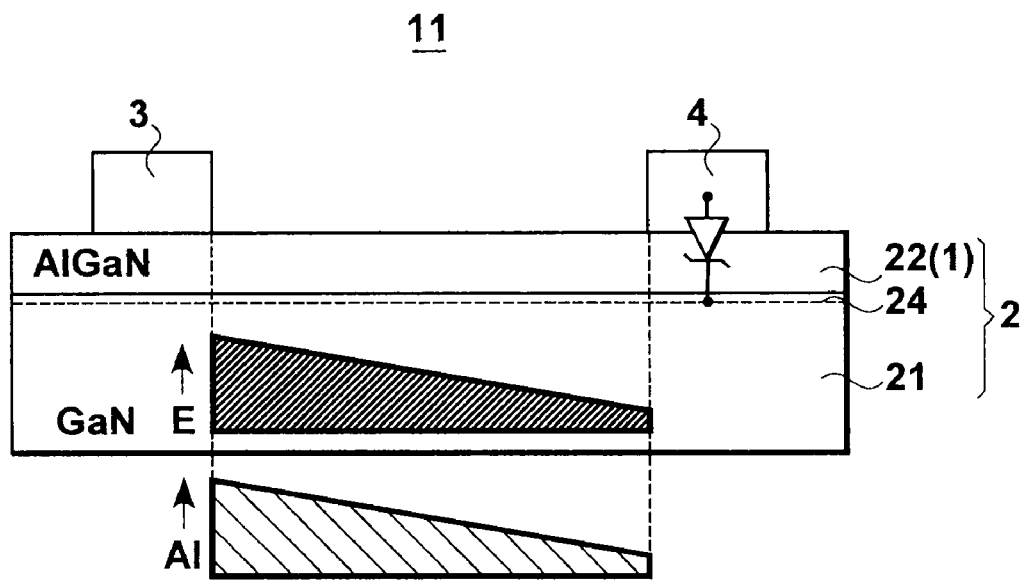
FIG. 12 is an exemplary cross sectional view for explaining the state of an electric field distribution and a compound profile of an element compound of a semiconductor device related to a sixth embodiment of the present invention.

As is shown in FIG. 12, in a SBD 11 (semiconductor device) of the sixth embodiment, a first compound semiconductor layer 21 having a two-dimensional carrier gas channel 24, a second compound semiconductor layer 22 (1) which is arranged via a hetero-junction above the first compound semiconductor layer 21, a first main electrode 3 which is connected to one end of the two-dimensional carrier gas channel 24, and a second main electrode 4 which is connected to the other end of the two-dimensional carrier gas channel 24 and which is separated from the first end, are arranged. The compound ratio of an elemental compound of the second compound semiconductor layer 22 (1) is different in the direction of the two-dimensional carrier gas channel 24 between the first main electrode 3 and the second main electrode 4. In the sixth embodiment, the first main electrode 3 is used as a cathode electrode with an ohmic connection to the two-dimensional carrier gas channel 24 and the second main electrode 4 is used an anode with a Schottky connection to the two-dimensional carrier gas channel 24.

Here, the compound semiconductor functional layer 2 is a nitride based semiconductor functional layer the same as the compound semiconductor functional layer 2 of the HEMT 1 related to the first embodiment stated above. Between the first main electrode 3 and the second main electrode 4 of the second compound semiconductor layer 22 (1), the compound ratio x2 of Al which is an elemental compound of the first main electrode 3 (anode electrode) side is set higher than the compound ratio x2 of Al which is an elemental compound of the second main electrode 4 (cathode electrode) side.

In the SBD 11 an electrical filed tends to concentrate at the second main electrode (cathode electrode) side which becomes a Schottky connection. Therefore, the same as the HEMT 1 related to the first embodiment stated above, by setting the compound ratio x2 of Al low at the second main electrode 4 side of the second compound semiconductor layer 22 (1) in the SBD 11, it is possible to reduce the carrier density near the second main electrode of the two-dimensional carrier gas channel 24 and also reduce the electrical field strength E.

Furthermore, the stacked structure of the compound semiconductor functional layer 2 of the SBD 11 related to the sixth embodiment may be changed to the stacked structure of the compound semiconductor functional layer 2 of the HEMT 1 related to the first and second transformation examples of the first embodiment stated above.

Characteristics of the Sixth Embodiment

As explained above, in the SBD 11 related to the sixth embodiment, it is possible modulate the carrier density of the two-dimensional carrier gas channel 24 which is produced in the compound semiconductor functional layer 2 and electrical field strength E in the travel direction of the carriers. As a result, because it is possible to weaken the electrical field strength E near the second main electrode 4 it is possible to improve breakdown resistivity.

Transformation Example

Figure 13:
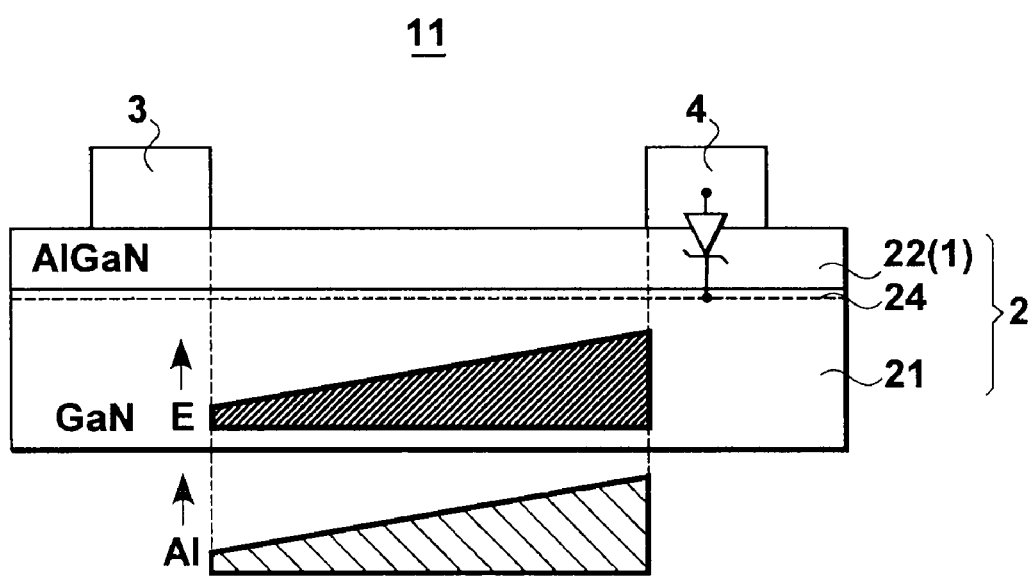
FIG. 13 is an exemplary cross sectional view for explaining the state of an electric field distribution and a compound profile of an element compound of a semiconductor device related to a transformed example of the sixth embodiment.

The basic structure of SBD 11 related to the transformation example of the sixth embodiment shown in FIG. 13 is the same as the SBD 11 shown in FIG. 12, however, the compound ratio x2 of Al at the first main electrode 3 side of the second compound electrode layer 22 (1) is set low and the compound ratio x2 of Al at the second main electrode 4 side of the second compound electrode layer 22 (1) is set high.

As explained in the HEMT 1 related to the second embodiment stated above, in the SBD 11 related to the transformation example formed in this way, it is possible to modulate the carrier density of the two-dimensional carrier gas channel 24 which is produced in the compound semiconductor functional layer 2 and electrical field strength E in the travel direction of the carriers. As a result, in the SBD 11 it is possible to increase the electrical field strength E near the second main electrode 4 and because it is possible to increase the speed of the carriers of the two-dimensional carrier gas channel 24 it is possible to achieve an increase in switching speed.

Furthermore, in the SBD 11 related to the sixth embodiment and its transformation example, the compound ratio of the elemental compound of the second compound semiconductor layer 22 (1) is continuously changed in the direction of the two-dimensional carrier gas channel 24, however, the compound ratio of the elemental compound of the second compound semiconductor layer 22 (1) may be changed in steps in the direction of the two-dimensional carrier gas channel 24, the same as the HEMT 1 related to the fifth embodiment stated above.

Seventh Embodiment

The seventh embodiment of the present invention will explain an example in which breakdown resistivity is improved as well as reducing the generation of a current collapse of the HEMT by applying the present invention to the HEMT which is a three terminal device as a semiconductor device.

Figure 14:
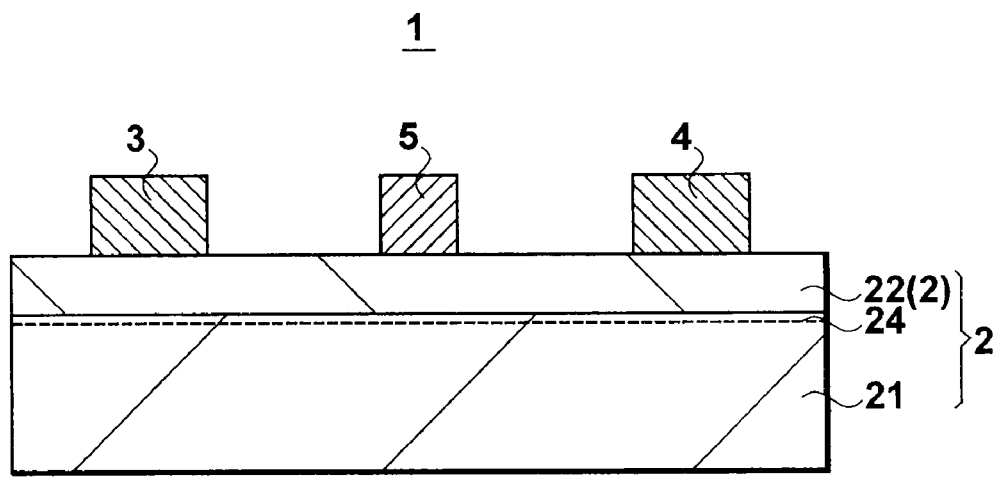
FIG. 14 is cross sectional view of the main components of a semiconductor device related to a seventh embodiment of the present invention.

As is shown in FIG. 14, in the HEMT 1 (semiconductor device) related to the seventh embodiment, a first compound semiconductor layer 21 having a two-dimensional carrier gas channel 24, a second compound semiconductor layer 22 (2) having a dopant and arranged as a barrier layer above the first compound semiconductor layer 21, a first main electrode 3 electrically connected to one end of the two-dimensional carrier gas channel 24, and a second main electrode 4 which is electrically connected to the other end which is separated from the first end of the two-dimensional carrier gas channel 24, are arranged. Between the first main electrode 3 and the second main electrode 4, the concentration of the dopant of the second compound semiconductor layer 22 (2) is different in the direction of the two-dimensional carrier gas channel 24. Furthermore, a gate electrode 5 is arranged between the first main electrode 3 and the second main electrode 4.

The first compound semiconductor layer 21 and the second compound semiconductor layer 22 (2) act as hetero-junction. The first compound semiconductor layer 21 and the second compound semiconductor layer 22 (2) form the compound semiconductor functional layer 2 and HEMT 1 is formed in this compound semiconductor functional layer 2. In the seventh embodiment the compound semiconductor functional layer 2, although not shown in the diagram the compound semiconductor functional layer 2 is formed directly on a substrate such as a silicon substrate, silicon carbide substrate or sapphire substrate or indirectly via a buffer layer for matching the crystalline of the compound semiconductor functional layer 2. The lattice constant is smaller in the compound semiconductor layer 22 (2) of the compound semiconductor functional layer 2 than in the first compound semiconductor layer 21 and the band-gap is larger. Therefore, the second compound semiconductor layer 22 (2) which is lattice matched to the first compound semiconductor layer 21 receives a tension stress.

Here, the compound semiconductor functional layer 2 is formed by a group III nitride based compound semiconductor material. A typical group III nitride based compound semiconductor is expressed as $Al_xIn_yGa_{1-x-y}N$ ($0 \leq x \leq 1$, $0 \leq y \leq 1$, or $0 \leq x+y \leq 1$).

Further, in the seventh embodiment, the Al (aluminum) compound ratio x1 of the first compound semiconductor layer 21 of the compound semiconductor functional layer 2 has a range of $0 \leq x1 < 1$, and the Al compound ratio x2 of the second compound semiconductor layer 22 (2) has a range of $0<x2\leq1$, and when there is relationship where the compound ratio x2 is larger compared to the compound ratio x1 (x1<x), the first compound semiconductor layer 21 is formed by a nitride semiconductor material expressed by $Al_{x1}Ga_{1-x}N$, and the second compound semiconductor layer 22 (2) is formed by a nitride semiconductor material expressed by $Al_{x2}Ga_{1-x2}N$. That is, the compound semiconductor functional layer 2 is formed by a stacked structure of the first compound semiconductor layer 21 formed from undoped AlGaN and the second compound semiconductor layer 22 (2) formed from doped (n doped) AlGaN. In addition, the compound semiconductor functional layer 2 is formed by a stacked structure of the first compound semiconductor layer 21 formed from undoped GaN and the second compound semiconductor layer 22 (2) formed from doped (n doped) AlGaN.

In the seventh embodiment, the thickness of the first compound semiconductor layer 21 is set at 0.5 μm to 10.0 μm, for example, and in the case of GaN the thickness is set at 0.5 μm to 3.5 μm. The thickness of the second compound semiconductor layer 22 (2) if set at 10 nm to 30 nm for example.

In the compound semiconductor functional layer 2, a two-dimensional carrier gas channel 24 (two-dimensional electron gas layer or two-dimensional hole gas layer) is produced at the surface part of the first compound semiconductor layer 21 which is near the hetero-junction interface surface between the first compound semiconductor layer 21 and the second compound semiconductor 22 (2) based on spontaneous polarization and a piezoelectric field of the first compound semiconductor layer 21 and the second compound semiconductor layer 22 (2). In the HEMT 1 related to the seventh embodiment, a two-dimensional carrier gas channel 24 is produced naturally near the hetero-junction interface surface based spontaneous polarization and a piezoelectric field using a c surface of the GaN layer and the HEMT 1 is a polar device. Here, the two-dimensional carrier gas channel 24 functions as an electron (carrier) channel having a high mobility in the HEMT 1.

In the seventh embodiment, the first main electrode 3 functions as a source electrode and the second main electrode 4 functions as a drain electrode. The first main electrode 3 and the second main electrode 4 are ohmic electrodes with a low resistance connected to the two-dimensional carrier gas channel 24. A voltage higher than a voltage applied to the first main electrode 3 is applied to the second main electrode 4, and when the gate electrode 5 is in an ON state, a current flows from the second main electrode 4 to the first main electrode 3 (electrons which are the carriers flow in reverse). In the seventh embodiment, the first main electrode 3 and the second main electrode 4 are formed by stacked layers of a Ti (titanium) layer having a thickness of 10 nm to 50 nm for example, and an Al layer having a thickness of 100 nm to 1000 nm for example, stacked on the Ti layer.

The gate electrode 5 is arranged above the second compound semiconductor layer 22 (2) and is connected to the two-dimensional carrier gas channel 24 via a schottky junction. The gate electrode 5 is formed by stacked layers of a Ni (Nickel) layer having a thickness of 100 nm to 500 nm for example, and an Au (gold) layer having a thickness of 0.1 m to 1.0 m for example, stacked on the Ni layer.

Furthermore, although not clearly shown in FIG. 14 and diagrams thereafter, the dimensions between the first main electrode 3 and the gate electrode 5 are set smaller than the dimensions between the second main electrode 4 and the gate electrode 5 due to the resistance relationship.

Figure 15:
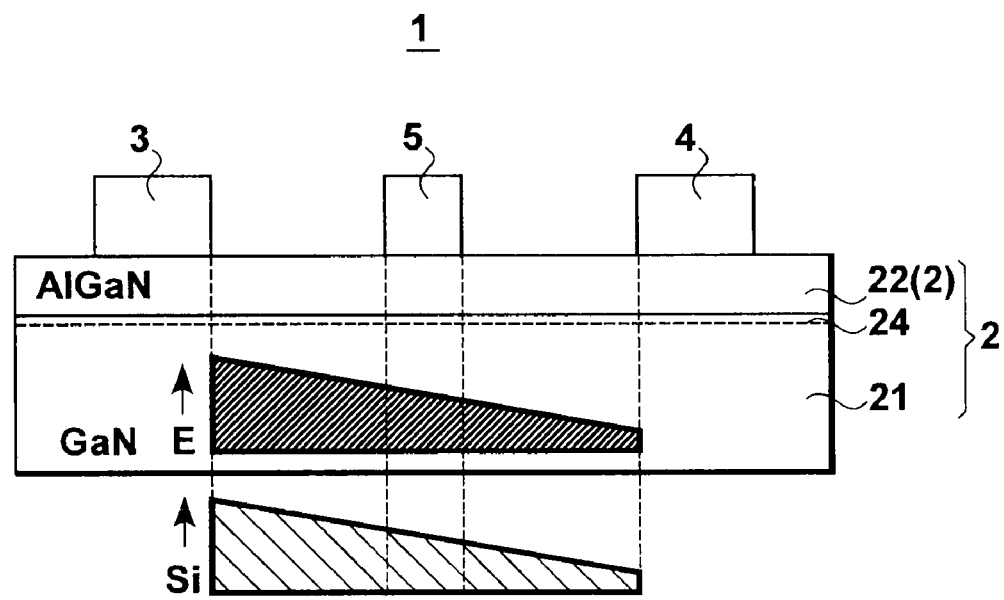
FIG. 15 is an exemplary cross sectional view for explaining the state of an electric field distribution and a dopant density profile of the semiconductor device shown in FIG. 14.

In the HEMT 1 formed in this way, as is shown in FIG. 15, the dopant concentration affecting the carrier density of the two-dimensional carrier gas channel 24 of the second compound semiconductor layer 22 (2) of the compound semiconductor functional layer 2 is set high (densely) at the first main electrode 3 side between the first main electrode 3 and the second main electrode 4, continuously decreases from the first main electrode 3 side towards the second main electrode 4 side and is set low (thinly) at the second main electrode 4 side. In other words, the dopant concentration of the second compound semiconductor layer 22 (2) is continuously different in the direction of the two-dimensional carrier gas channel 24.

When the dopant concentration increases, the band-gap of the second compound semiconductor layer 22 (2) is offset, the carriers increase and the electrical field strength E becomes stronger. Reversely, when the dopant concentration decreases, the offset of the band-gap of the second compound semiconductor layer 22 (2) becomes smaller, the carriers decrease and the electrical field strength E becomes weaker.

In the seventh embodiment, a group IV element such as silicon (Si) which is an n type impurity can be practically used as the dopant. Then, in a high dopant concentration region at the first main electrode 3 side, the dopant concentration is set for example in a range of $10^{19}$ atoms/cm$^3$ to $10^{21}$ atoms/cm$^3$. In a low dopant concentration region at the second main electrode 4 side, the dopant concentration is set for example in a range of 0 atoms/cm$^3$ to $10^{17}$ atoms/cm$^3$ which is equivalent to being undoped. Therefore, it's preferred that the dopant concentration be continuously changed within a range of 0 atoms/cm$^3$ to $10^{21}$ atoms/cm$^3$.

[Operation Principles of the HEMT]

As is shown in FIG. 15, in the HEMT 1 related to the seventh embodiment stated above, the dopant concentration (here, dopant concentration of Si) of the second compound semiconductor layer 22 (2), is set high at the first main electrode 3 side, decreases continuously from the first main electrode 3 side towards the second main electrode 4 side in the direction of the two-dimensional carrier gas channel 24, and is set low at the second main electrode 4 side. That is, the dopant concentration of the second compound semiconductor 22 (2) is different between the first main electrode 3 side and the second main electrode 4 side and asymmetrical. Therefore, the carrier density of the two-dimensional gas channel 24 is different in the HEMT 1 and the carrier density of the two-dimensional gas channel 24 in the second main electrode 4 side of the second compound semiconductor layer 22 (2) becomes lower than the carrier density of the two-dimensional gas channel 24 in the first main electrode 3 side.

In addition, as is shown FIG. 15, the electrical field strength E becomes lower at the second main electrode 4 side than the first main electrode 3 side. In other words, when a voltage is applied and the HEMP 1 is in an ON state, conventionally, the electrical field strength at the second main electrode 4 side becomes larger so that the voltage of the second main electrode 4 becomes higher than the voltage of the first main electrode 3, however, the HEMT 1 related to the seventh embodiment can be controlled so that the electrical field strength E is reduced, the electrical field strength distribution made uniform, and the electrical field concentration at the second main electrode 4 side of the gate electrode 4 can be relaxed. Therefore, because it is possible to reduce the generation of hot electrons near the second main electrode 4 (drain electrode), it is possible to reduce the generation of current collapse in the HEMT 1.

In addition, in the HEMT 1, because it is possible to reduce the electrical field strength E generated at the second main electrode 4 side end of the gate electrode 5 compared to the electrical field strength E generated at the first main electrode 3 side end, it is possible to improve breakdown resistivity.

[Manufacturing Method of the HEMT]

Although the manufacturing method will not particularly be explained using the diagrams, the second compound semiconductor layer 22 (2) of the HEMT 1 stated above is formed by the manufacturing method as follows.

First, a GaN layer or AlGaN layer is formed above the first compound semiconductor layer 21. Next, using a mask where the first main electrode 3 side is thin and the second main electrode 4 side is thick, Si is introduced to so the GaN layer or AlGaN layer so that the dopant concentration in the direction of the two-dimensional carrier gas channel 24 is different. Here, the dopant amount of Si is large at the first main electrode 3 side, decreases continuously from the first main electrode 3 side towards the second main electrode 4 side, and is small at the second main electrode side 4. It is possible to practically use an ion implantation method for example for doping the Si. Via these processes, it is possible to form the second compound semiconductor layer 22 (2) in which the dopant concentration is different in the direction of the two-dimensional carrier gas channel 24.

In addition, a gray scale mask method or a mask retreat method can be used in the manufacturing method of the HEMT 1 related to the seventh embodiment and it is possible to introduce Si so that the dopant concentration is different.

Characteristics of the Seventh Embodiment

As explained above, in the HEMT 1 related to the seventh embodiment it is possible to modulate the carrier density and electrical field strength E of the two-dimensional carrier gas channel 24 which is produced in the compound semiconductor functional layer 2 in the travelling direction of the carriers. As a result, in the HEMT 1, it is possible to reduce the generation of hot electrons near the second main electrode 4 and reduce the generation of a breakdown current. In addition, in the HEMT 1, because the electrical field strength E of the gate electrode 5 end part is lowered, it is possible to improve breakdown resistivity.

First Transformation Example

The HEMT 1 related to the first transformation example of the seventh embodiment will be used to explain an example in which the nitride based semiconductor material of the compound semiconductor functional layer 2 is replaced.

The compound semiconductor functional layer 2 of the HEMT 1 related to the first transformation example is formed by a stacked layer structure of a first compound semiconductor layer 21 formed from undoped InGaN and a second compound semiconductor layer 22 (2) formed from doped AlInN.

A compound ratio y1 of In (indium) of the first compound semiconductor layer 21 has range of $0<y1<1$, and the first compound semiconductor layer 21 is a nitride based semiconductor material expressed by $In_yGa_{1-y1}N$. The compound ratio x2 of Al of the second compound semiconductor layer 22 (2) has a range of $\geq x2<1$ and the compound ratio y2 of In has a range of $0<y2<1$, and the second compound semiconductor layer 22 (2) is a nitride based semiconductor material expressed by $Al_{x2}In_{1-y2}N$.

In the HEMT 1 related to the first transformation example, the same as the HEMT 1 related to the seventh embodiment stated above, the dopant concentration of the second compound semiconductor layer 22 (2) of the compound semiconductor functional layer 2 is set high at the first main electrode 3 side between the first main electrode 3 and the second main electrode 4, continuously decreases from the first main electrode 3 side towards the second main electrode 4 side and is set low at the second main electrode 4 side. In other words, the Al compound ratio x2 is continuously different in the direction of the two-dimensional carrier gas channel 24.

In the HEMT 1 related to the first transformation example formed in this way, it is possible to demonstrate the same effects as the operational effects obtained by the HEMT 1 related to the seventh embodiment.

Second Transformation Example

The HEMT 1 related to the second transformation example of the seventh embodiment explains an example in which the present invention is applied to a non-polar device.

Figure 16:
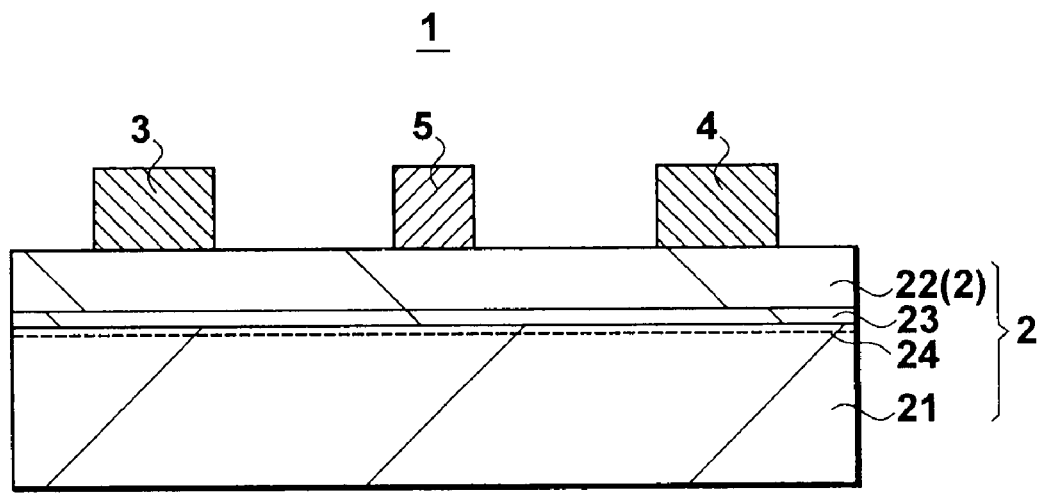
FIG. 16 is cross sectional view of the main components of a semiconductor device related to a second transformed example of the seventh embodiment.

As is shown in FIG. 16, in the HEMT 1 related to the second translation example, an undoped third compound semiconductor layer 23 (undoped layer) which does not have dopants is arranged between the first compound semiconductor layer 21 and the second compound semiconductor later 22 (2) which does have dopants. It is possible to use the same material, a layer of AlGaN for example, as the second compound semiconductor layer 22 (2) for the material of the third compound semiconductor layer 23, and the thickness of this AlGaN layer is set at 5 nm to 15 nm.

The third compound semiconductor layer 23 functions as a barrier layer (a diffusion preventing layer) and the second compound semiconductor layer 22 (2) functions as a carrier supply layer. Further, the stacked structure is not limited to this example. The third compound semiconductor layer 23 may be formed above the second compound semiconductor layer 22 (2) or a stacked structure where the third compound semiconductor layer 23 exists inside the second compound semiconductor layer 22 (2) is possible.

In addition, it is possible to use an m-surface or a-surface which are non-polar surface instead of the c surface which is a polar surface first in the compound semiconductor layer 21.

Also in the HEMT 1 related to the second transformation example formed in this way, the same as the HEMT 1 related to the seventh embodiment stated above, the concentration of dopants of the second compound semiconductor layer 22 (2) is different in the direction of the two-dimensional carrier gas channel 24. Therefore, in the HEMT 1 related to the second transformation example, it is possible to demonstrate the same effects as the operational effects obtained by the HEMT 1 related to the seventh embodiment.

Furthermore, in the HEMT 1 related to the second transformation example, the same as the HEMT 1 related to the first transformation example stated above, it is possible to replace the nitride base semiconductor material of the compound semiconductor functional layer 2.

Third Transformation Example

The HEMT 1 related to the third transformation example of the seventh embodiment will be used to explain an example in which the structure of the compound semiconductor functional layer is changed.

Figure 17:
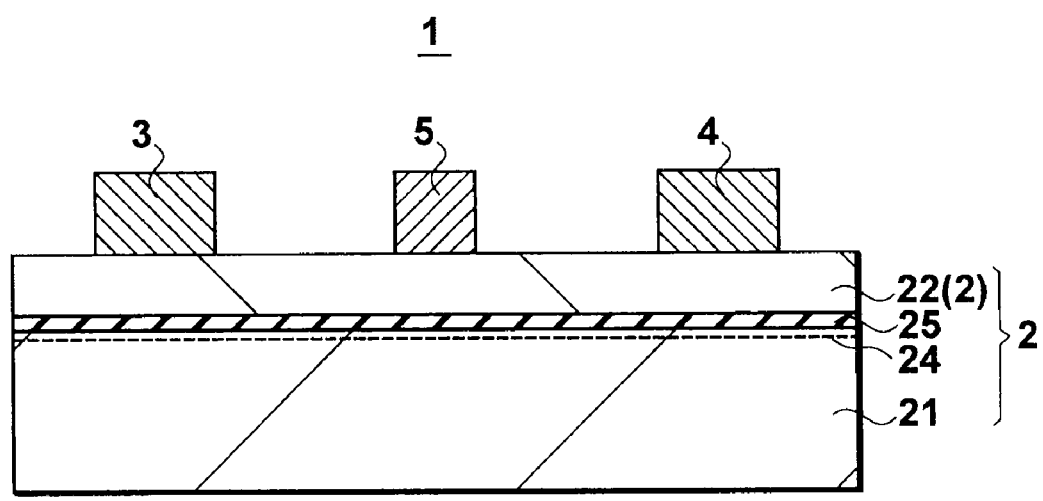
FIG. 17 is cross sectional view of the main components of a semiconductor device related to a third transformed example of the seventh embodiment.

As is shown in FIG. 17, in the HEMT 1 related to the third translation example, a spacer layer 25 is arranged between the first compound semiconductor layer 21 and the second compound semiconductor later 22 (2) which has dopants. It is possible to use a layer of AlN for example, which is a nitride based semiconductor material, as the spacer layer 25 and the thickness of this AlN layer is set at 0.5 nm to 1.5 nm.

The spacer layer 25 extends the supply of carriers from the second compound semiconductor layer 22 (2) to the first compound semiconductor layer 21 making it easy to generate the two-dimensional carrier gas channel 24. Therefore, the same as the HEMT 1 related to the second transformation example, it is possible to use an m-surface which is a non-polar surface or a-surface instead of the c surface which is a polar surface. In other words, the HEMT 1 related to the third transformation example, can be applied to a non-polar device.

Also in the HEMT 1 related to the third transformation example formed in this way, the same as the HEMT 1 related to the seventh embodiment stated above, the concentration of dopants of the second compound semiconductor layer 22 (2) is different in the direction of the two-dimensional carrier gas channel 24. Therefore, in the HEMT 1 related to the third transformation example, it is possible to demonstrate the same effects as the operational effects obtained by the HEMT 1 related to the seventh embodiment.

Furthermore, in the HEMT 1 related to the third transformation example, the same as the HEMT 1 related to the first transformation example stated above, it is possible to replace the nitride base semiconductor material of the compound semiconductor functional layer 2.

Eighth Embodiment

The eighth embodiment of the present invention explains an example in which the present invention is applied to the HEMT 1 as a semiconductor device and in which the increased carrier speed of this HEMT is achieved.
[Structure of the HEMT]

Figure 18:
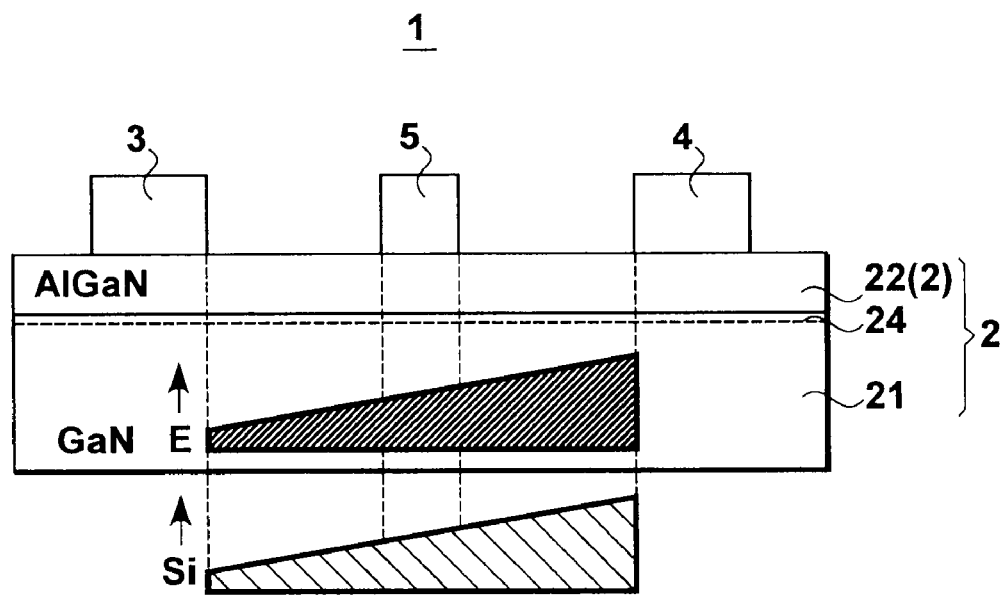
FIG. 18 is an exemplary cross sectional view for explaining the state of an electric field distribution and a dopant density profile of a semiconductor device related to an eighth embodiment of the present invention.

As is shown in FIG. 18, the basic structure of the HEMT 1 (semiconductor device) related to the eighth embodiment is the same as the HEMT 1 related to the seventh embodiment, however, the dopant concentration is set low at the first main electrode 3 side of the second compound semiconductor layer 22 (2), is continuously increased from the first main electrode 3 towards the second main electrode 4 and is set high at the second main electrode 4 side. In other words, in the HEMT 1 related to the eighth embodiment, the dopant concentration of the second compound semiconductor layer 22 (2) of the HEMT 1 related to the seventh embodiment is different in the reverse direction to the direction of the two-dimensional carrier gas channel 24 in which dopant concentration of the second compound semiconductor layer 22 (2) of the HEMT 1 related to the seventh embodiment is different.
[Operation Principles of the HEMT]

As is shown in FIG. 18, in the HEMT 1 related to the eighth embodiment stated above, the dopant concentration of the second compound semiconductor layer 22 (2), is set low at the first main electrode 3 side, increases continuously from the first main electrode 3 side towards the second main electrode 4 side in the direction of the two-dimensional carrier gas channel 24, and is set high at the second main electrode 4 side. That is, the dopant concentration of the second compound semiconductor 22 (2) is different between the first main electrode 3 side and the second main electrode 4 side and asymmetrical. Therefore, distortions in the second compound semiconductor layer 22 (2), in the HEMT 1, the carrier density of the two-dimensional gas channel 24 is different, and the carrier density at the second main electrode 4 side becomes higher than the carrier density of the two-dimensional gas channel 24 at the first main electrode 3 side.

In addition, as is shown in FIG. 18, the electrical field strength E becomes higher at the second main electrode 4 side than the first main electrode 3 side. In other words, it is possible to increase (modulate) the electrical strength E in a reverse direction (travel direction of the carriers) to the electrical field direction from the second main electrode 4 towards the first main electrode 3. Therefore, in the HEMT 1, because it is possible to increase the speed of the carriers of the two-dimensional carrier gas channel 24 near the second main electrode 4 (drain electrode), it is possible to achieve an increase in switching speed.

Furthermore, because the manufacturing method of the HEMT 1 related to the eighth embodiment is the same as the manufacturing method related to the seventh embodiment stated above, here explanations which overlap will be omitted. In addition, in the HEMT 1 related to the eighth embodiment, it is possible to change the material or the stacked structure of the compound semiconductor functional layer 2 the same as any of the HEMTs 1 related to the first to fourth transformation examples of the seventh embodiment stated above.

Characteristics of the Eighth Embodiment

As was explained above, in the HEMT 1 related to the eighth embodiment, it is possible to modulate the carrier density of the two-dimensional carrier gas channel 24 which is produced in the compound semiconductor functional layer 2 and electrical field strength E in the travel direction of the carriers. As a result, in the HEMT 1, it is possible to increase the electrical field strength E near the second main electrode 4 and because it is possible to increase the speed of the carriers of the two-dimensional carrier gas channel 24 it is possible to achieve an increase in switching speed.

Ninth Embodiment

The ninth embodiment of the present invention will explain an example in which breakdown resistivity is improved as well as increasing the carrier mobility speed of the carriers of the HEMT by applying the present invention to the HEMT as a semiconductor device.
[Structure of the HEMT]

Figure 19:
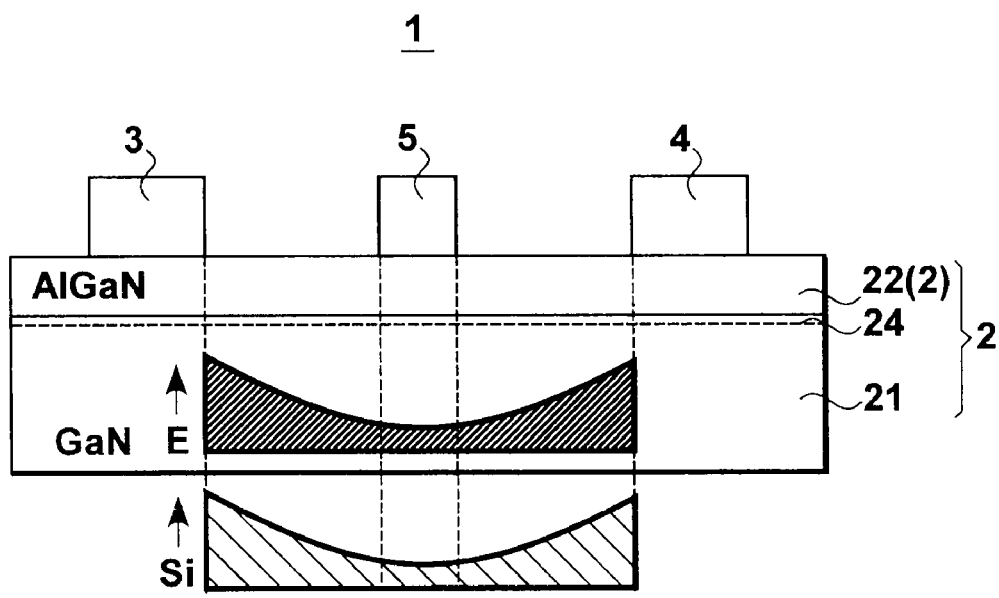
FIG. 19 is an exemplary cross sectional view for explaining the state of an electric field distribution and a dopant density profile of a semiconductor device related to a ninth embodiment of the present invention.

As is shown in FIG. 19, the basic structure of the HEMT 1 (semiconductor device) related to the ninth embodiment is the same as the HEMT 1 related to the seventh embodiment, however, the dopant concentration is set high at the first main electrode 3 side of the second compound semiconductor layer 22 (2), is continuously decreased from the first main electrode 3 towards the gate electrode 5, is set low at the gate electrode 5 part particularly the second main electrode 4 side end part, is continuously increased from the gate electrode 5 towards the second main electrode and is again set high at the second main electrode 4 side. In other words, in the HEMT 1, the dopant concentration of the second compound semiconductor layer 22 (2) is set low in the region corresponding to the gate electrode 5 and is set high at the second main electrode 4 side.
[Operation Principles of the HEMT]

As is shown in FIG. 19, in the HEMT 1 related to the ninth embodiment stated above, the dopant concentration of the second compound semiconductor layer 22 (2), is set high at the first main electrode 3 side, decreases continuously from the first main electrode 3 side towards the gate electrode 4 side in the direction of the two-dimensional carrier gas channel 24, and is set low in the region corresponding to the gate electrode 5. Then, the dopant concentration of the second compound semiconductor layer 22 (2) increase continuously from the gate electrode 5 side towards the second main electrode 4 side in the direction of the two-dimensional carrier gas channel 24, and is set high at the second main electrode 4 side. That is, the dopant concentration of the second compound semiconductor layer 22 (2) is different between the first main electrode 3 side and the second main electrode 4 side and the region corresponding to the gate electrode 5, and is almost symmetrical between the first main electrode 3 side and the second main electrode 4 side with the gate electrode 5 in the center. Therefore, the carrier density of the two-dimensional gas channel 24 is different, and the carrier density at the second main electrode 4 side becomes higher than the carrier density of the two-dimensional gas channel 24 at the first main electrode 3 side.

In addition, as is shown in FIG. 19, the electrical field strength E becomes higher at the second main electrode 4 side than the region corresponding to the gate electrode 5. In other words, it is possible to increase (modulate) the electrical strength E in a reverse direction (travel direction of the carriers) to the electrical field direction from the second main electrode 4 towards the first main electrode 3. Therefore, in the HEMT 1, because it is possible to increase the speed of the carriers of the two-dimensional carrier gas channel 24 near the second main electrode 4 (drain electrode), it is possible to achieve an increase in switching speed.

In addition, in the HEMT 1, because it is possible to reduce the electrical field strength E generated at the second main electrode 4 side end of the gate electrode 5 compared to the electrical field strength E generated at the second main electrode 4 side end, it is possible to improve breakdown resistivity.

Furthermore, because the manufacturing method of the HEMT 1 related to the ninth embodiment is the same as the manufacturing method related to the seventh embodiment stated above, here explanations which overlap will be omitted. In addition, in the HEMT 1 related to the ninth embodiment, it is possible to change the material or the stacked structure of the compound semiconductor functional layer 2 the same as any of the HEMTs 1 related to the first to fourth transformation examples of the seventh embodiment stated above.

Characteristics of the Ninth Embodiment

As was explained above, in the HEMT 1 related to the ninth embodiment, it is possible to modulate the carrier density of the two-dimensional carrier gas channel 24 which is produced in the compound semiconductor functional layer 2 and electrical field strength E in the travel direction of the carriers. As a result, in the HEMT 1, it is possible to increase the electrical field strength E near the second main electrode 4 and because it is possible to increase the speed of the carriers of the two-dimensional carrier gas channel 24 it is possible to achieve an increase in switching speed. In addition, because it is possible to lower the electrical field strength E of the gate electrode 5 end part, it is possible to improve breakdown resistivity.

Tenth Embodiment

The tenth embodiment of the present invention will explain an example in which the generation of a current collapse of the HEMT is reduced by applying the present invention to the HEMT as a semiconductor device.

[Structure of the HEMT]

Figure 20:
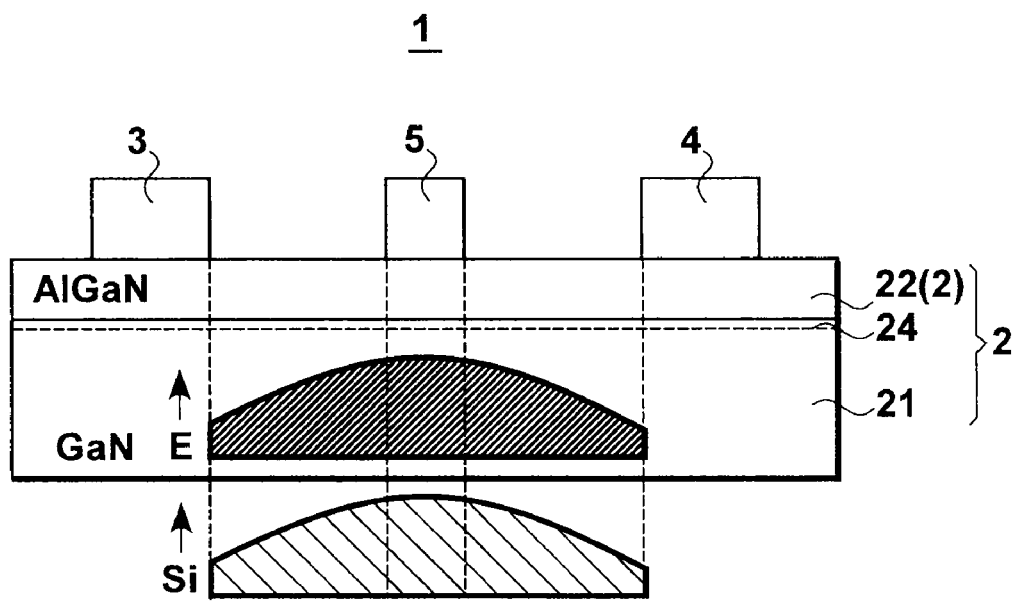
FIG. 20 is an exemplary cross sectional view for explaining the state of an electric field distribution and a dopant density profile of a semiconductor device related to a tenth embodiment of the present invention.

As is shown in FIG. 20, the basic structure of the HEMT 1 (semiconductor device) related to the tenth embodiment is the same as the HEMT 1 related to the seventh embodiment, however, the dopant concentration is set low at the first main electrode 3 side of the second compound semiconductor layer 22 (2), is continuously increased from the first main electrode 3 towards the gate electrode 5, is set high at the gate electrode 5 part, is continuously decreased from the gate electrode 5 towards the second main electrode 4 and is again set low at the second main electrode 4 side. In other words, in the HEMT 1, the dopant concentration of the second compound semiconductor layer 22 (2) is set high in the region corresponding to the gate electrode 5 and is set low at the second main electrode 4 side.

[Operation Principles of the HEMT]

As is shown in FIG. 20, in the HEMT 1 related to the tenth embodiment stated above, the dopant concentration of the second compound semiconductor layer 22 (2), is set low at the first main electrode 3 side, increases continuously from the first main electrode 3 side towards the gate electrode 5 side in the direction of the two-dimensional carrier gas channel 24, and is set high in the region corresponding to the gate electrode 5. Then, the dopant concentration of the second compound semiconductor layer 22 (2) decreases continuously from the gate electrode 5 side towards the second main electrode 4 side in the direction of the two-dimensional carrier gas channel 24, and is set low at the second main electrode 4 side. That is, the dopant concentration of the second compound semiconductor 22 (2) is different between the first main electrode 3 side and the second main electrode 4 side and the region corresponding to the gate electrode 5, and is almost symmetrical between the first main electrode 3 side and the second main electrode 4 side with the gate electrode 5 in the center. Therefore, in the HEMT 1, the carrier density of the two-dimensional gas channel 24 is different, and the carrier density at the second main electrode 4 side becomes lower than the carrier density of the two-dimensional gas channel 24 at the region corresponding to the gate electrode 5.

In addition, as is shown in FIG. 20, the electrical field strength E becomes higher at the second main electrode 4 side than the region corresponding to the gate electrode 5. In other words, when a voltage is applied and the HEMP is in an OFF state, conventionally, the electrical field strength at the second main electrode 4 side becomes larger so that the voltage of the second main electrode 4 becomes higher than the voltage of the first main electrode 3, however, the HEMT 1 related to the tenth embodiment can be controlled so that the electrical field strength E is reduced and the electrical field strength distribution made uniform. Therefore, because it is possible to reduce the generation of hot electrons near the second main electrode 4 (drain electrode), it is possible to reduce the generation of current collapse in the HEMT 1. In addition, it is possible to reduce the dopant concentration directly below the gate electrode 5 and if a structure is adopted whereby the carrier density is decreased, it is possible to reduce a gate leak current.

Furthermore, because the manufacturing method of the HEMT 1 related to the tenth embodiment is the same as the manufacturing method related to the seventh embodiment stated above, here explanations which overlap will be omitted. In addition, in the HEMT 1 related to the tenth embodiment, it is possible to change the material or the stacked structure of the compound semiconductor functional layer 2 the same as any of the HEMTs 1 related to the first to fourth transformation examples of the seventh embodiment stated above.

Characteristics of the Tenth Embodiment

As was explained above, in the HEMT 1 related to the tenth embodiment, it is possible to modulate the carrier density of the two-dimensional carrier gas channel 24 which is produced in the compound semiconductor functional layer 2 and electrical field strength E in the travel direction of the carriers.

As a result, in the HEMT 1, it is possible to decrease the generation of hot electrons near the second main electrode 4 and reduce the generation of a current collapse.

Eleventh Embodiment

The eleventh embodiment of the present invention will explain an example in which the generation of a current collapse of the HEMT is reduced by applying the present invention to the HEMT as a semiconductor device.
[Structure of the HEMT]

Figure 21:
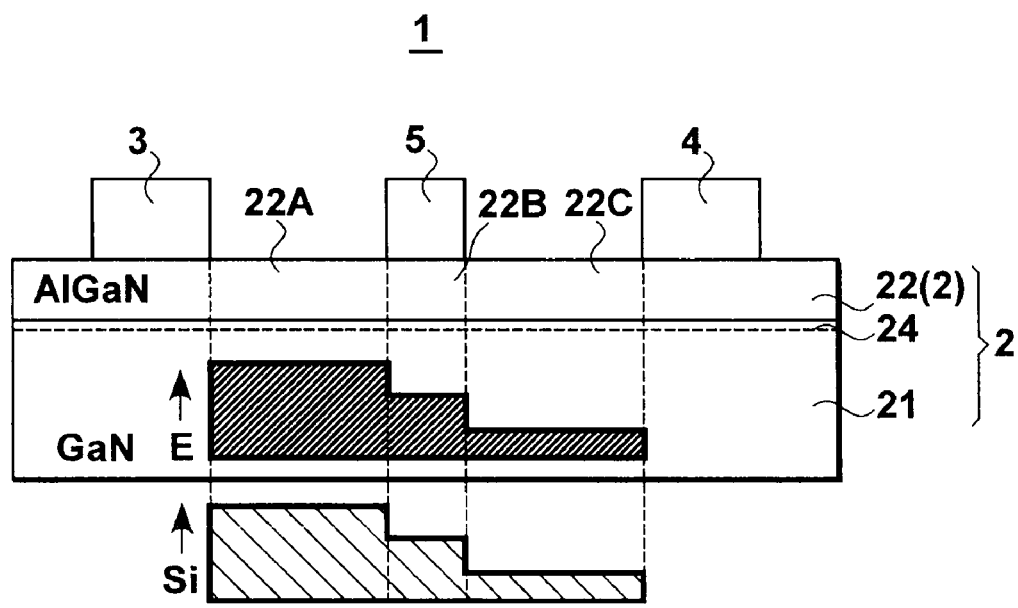
FIG. 21 is an exemplary cross sectional view for explaining the state of an electric field distribution and a dopant density profile of a semiconductor device related to an eleventh embodiment of the present invention.

As is shown in FIG. 21, the basic structure of the HEMT 1 (semiconductor device) related to the eleventh embodiment is the same as the HEMT 1 related to the seventh embodiment, however, the dopant concentration is set high at the first main electrode 3 side of the second compound semiconductor layer 22 (2), is decreased in steps from the first main electrode 3 towards the gate electrode 5, and is set low at the gate electrode 5 part. That is, in the HEMT 1, a first region 22A in which the dopant concentration is set high is arranged at the first main electrode 3 side, a third region 22C in which dopant concentration is set low is arranged on the second main electrode 4 side, and a second region 22B in which the dopant concentration is set between these the first and third regions, is arranged between the first region 22A and the third region 22C. Here in steps means a region of a constant dopant concentration which continues at certain intervals in the direction of the two-dimensional carrier gas channel 24 and then a different region of a constant dopant concentration which continues at certain intervals in the direction of the two-dimensional carrier gas channel 24.
[Operation Principles of the HEMT]

As is shown in FIG. 21, in the HEMT 1 related to the eleventh embodiment stated above, the dopant concentration of the second compound semiconductor layer 22 (2), is set high at the first main electrode 3 side, decreases in steps from the first main electrode 3 side towards the second main electrode 4 side in the direction of the two-dimensional carrier gas channel 24, and is set low at the second main electrode 4 side. That is, the dopant concentration of the second compound semiconductor 22 (1) is different between the first main electrode 3 side and the second main electrode 4 side and is asymmetrical. Therefore, the carrier density of the two-dimensional carrier gas channel 24 is different in the HEMT 1, and the carrier density of the two-dimensional carrier gas channel 24 at the second main electrode 4 side of the second compound semiconductor layer 22 (1) becomes lower than the carrier density of the two-dimensional carrier gas channel 24 in the region corresponding to the gate electrode 5.

In addition, as is shown in FIG. 21, the electrical field strength E becomes lower at the second main electrode 4 side than the region corresponding to the gate electrode 5. In other words, when a voltage is applied and the HEMT 1 is in an OFF state, conventionally, the electrical field strength at the second main electrode 4 side becomes larger so that the voltage of the second main electrode 4 becomes higher than the voltage of the first main electrode 3, however, the HEMT 1 related to the eleventh embodiment can be controlled so that the electrical field strength E is reduced and the electrical field strength distribution made uniform. Therefore, because it is possible to reduce the generation of hot electrons near the second main electrode 4 (drain electrode), it is possible to reduce the generation of current collapse in the HEMT 1.
[Manufacturing Method of the HEMT]

The manufacturing method of the HEMT 1 related to the eleventh embodiment stated above is as follows.

Figure 22:
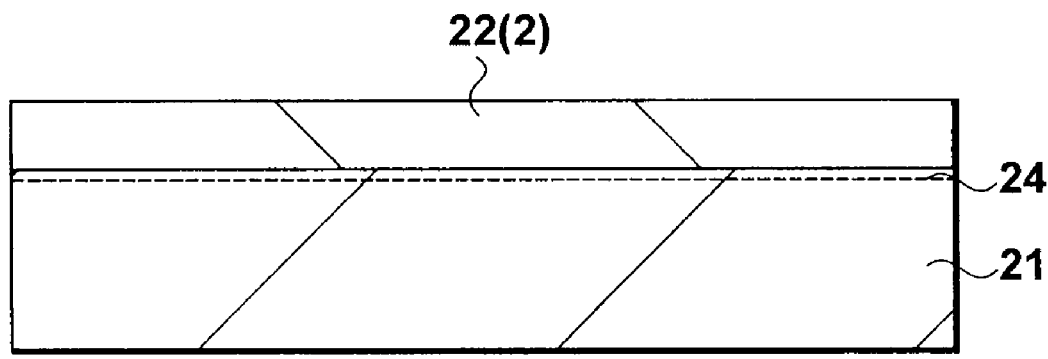
FIG. 22 is first process cross sectional view for explaining a manufacturing method of the semiconductor device related to the eleventh embodiment.

First, as is shown in FIG. 22, the second compound semiconductor layer 22 (2) is formed above the first compound semiconductor layer 1. The second compound semiconductor layer 22 (2) may be formed as a film by a MOCVD method for example.

Figure 23:
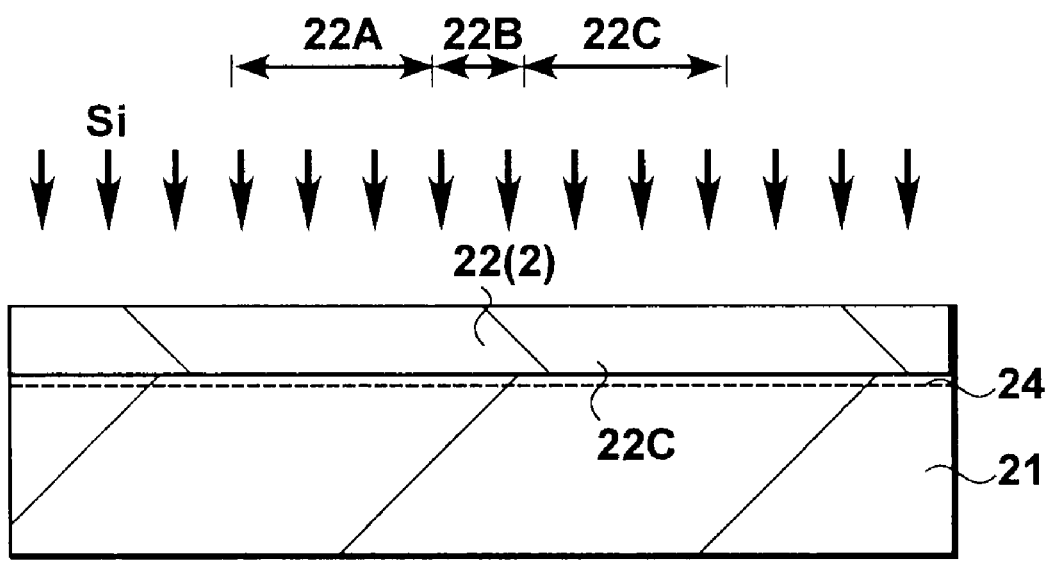
FIG. 23 is a second process cross sectional view.

As is shown in FIG. 23, a low concentration of dopants are introduced to at least a formation region of the third region 22 of the second compound semiconductor layer 22 (2), here, to each of the formation regions of the first region 22A, second region 22B and third region 22C, and the third region 22C is formed on the entire area of the second compound semiconductor layer 22 (2). Si, for example, is used as the dopant as explained in the manufacturing method of the HEMT 1 related to the seventh embodiment stated above, and the Si is introduced by an ion implantation method. The dopant concentration is set in a range, for example, of $10^{16}$ atoms/cm³ to $10^{17}$ atoms/cm³.

Figure 24:
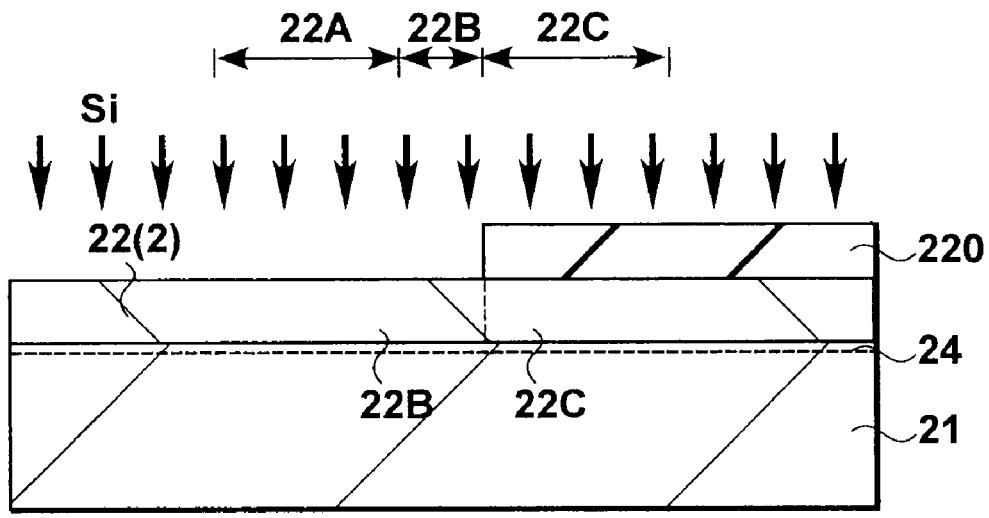
FIG. 24 is a third process cross sectional view.

Next, the formation region of the second region 22B of the second compound semiconductor layer 22 (2) is opened and a mask 220 which covers at least the formation region of the third region 22C is formed. As is shown in FIG. 24, a dopant is introduced using the mask 220 so that it has a middle level of concentration in at least the formation region of the second region 22B. Si, for example, is used for the dopant the same as stated above, and the Si is introduced by an ion implantation method. The dopant concentration is set in a range, for example, of $10^{18}$ atoms/cm³ to $10^{19}$ atoms/cm³. After this the mask 220 is removed.

Figure 25:
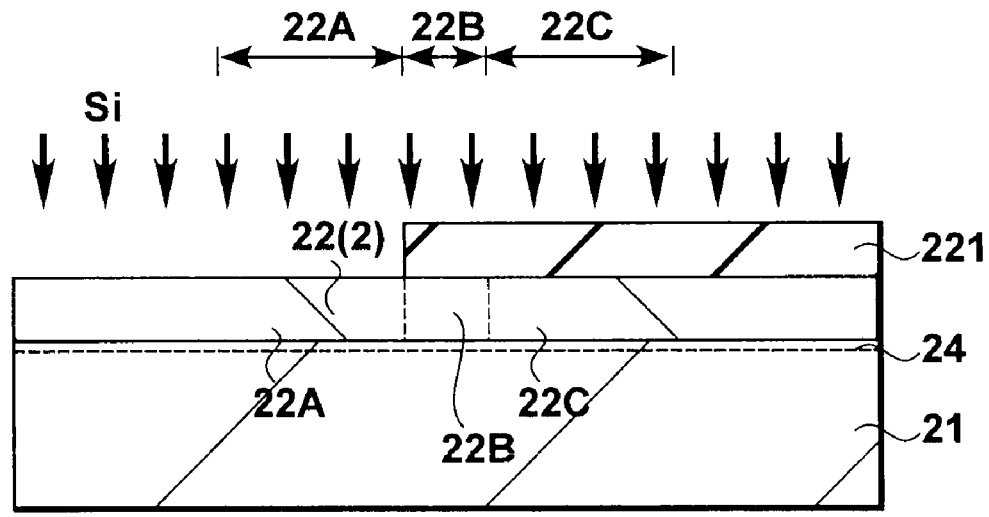
FIG. 25 is a fourth process cross sectional view.

Next, the formation region of the first region 22A of the second compound semiconductor layer 22 (2) is opened and a mask 221 which covers the formation regions of the second region 22A and the third region 22C is formed. As is shown in FIG. 25, a dopant is introduced using the mask 221 so that it has a high level of concentration in the formation region of the first region 22A. Si, for example, is used for the dopant the same as stated above, and the Si is introduced by an ion implantation method. The dopant concentration is set in a range, for example, of $10^{20}$ atoms/cm³ to $10^{21}$ atoms/cm³. When the first region 22A is formed, the second compound semiconductor layer 22 (2) in which the dopant concentration is different in the direction of the two-dimensional carrier gas channel 24 is complete. After this the mask 221 is removed.

Furthermore, in the case where a dopant is introduced to each of the first region 22A, second region 22B and third region 22C separately, the introduction order to each region is not particularly limited.

Furthermore, the same as the manufacturing method of the HEMT 1 related to the seventh embodiment stated above, the thickness at the first main electrode side is thin, a mask is formed in which the thickness becomes thicker in steps towards the second main electrode 4 side, Si is doped by ion implantation using this mask and it is possible to change the dopant concentration. In this case, it is possible to change the dopant concentration by one ion implantation process and thus reduce the number of manufacturing processes.

Characteristics of the Eleventh Embodiment

As was explained above, in the HEMT 1 related to the eleventh embodiment, it is possible to modulate the carrier density of the two-dimensional carrier gas channel 24 which is produced in the compound semiconductor functional layer 2 and electrical field strength E in the travel direction of the carriers. As a result, in the HEMT 1, it is possible to decrease the generation of hot electrons near the second main electrode 4 and reduce the generation of a current collapse.

Furthermore, in the HEMT 1 related to the eleventh embodiment, it is possible to change the material or the stacked structure of the compound semiconductor functional layer 2 the same as any of the HEMTs 1 related to the first to fourth transformation examples of the seventh embodiment stated above.

Transformation Example

The HEMT 1 related to the transformation example of the eleventh embodiment, in the HEMT 1 related to the eleventh embodiment shown in FIG. 21, the dopant concentration of the first region 22A arranged at the first main electrode 3 side of the second compound semiconductor layer 22 (2) of the compound semiconductor functional layer 2 is set low, the dopant concentration of the third region 22C is set high and the dopant concentration of the second region 22B is set to a level between these. That is, in the HEMT 1 related to the transformation example of the eleventh embodiment, the dopant concentration is set low at the first main electrode 3 side of the second compound semiconductor, is increased in steps from the first main electrode 3 to the second main electrode 4 and is set high at the second main electrode 4 side.

In the HEMT 1 related to the eleventh embodiment formed in this way, it is possible to modulate the carrier density of the two-dimensional carrier gas channel 24 which is produced in the compound semiconductor functional layer 2 and electrical field strength E in the travel direction of the carriers. As a result, in the HEMT 1, it is possible to increase the electrical field strength E near the second main electrode 4 and because it is possible to increase the speed of the carriers of the two-dimensional carrier gas channel 24 it is possible to achieve an increase in switching speed.

Twelfth Embodiment

In the twelfth embodiment of the present invention, the present invention is applied as a semiconductor to a Schottky barrier diode (SBD) which is a two terminal element and an example in which resistance of this SBD is improved is explained.

[Structure of the SBD]

Figure 26:
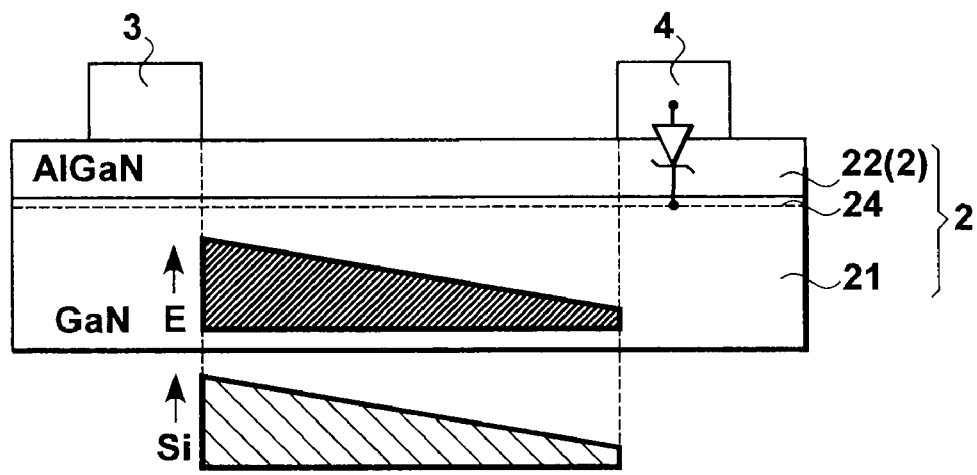
FIG. 26 is an exemplary cross sectional view for explaining the state of an electric field distribution and a dopant density profile of a semiconductor device related to a twelfth embodiment of the present invention.

As is shown in FIG. 26, in a SBD 11 (semiconductor device) of the tenth embodiment, a first compound semiconductor layer 21 having a two-dimensional carrier gas channel 24, a second compound semiconductor layer 22 (2) which is arranged via a hetero-junction above the first compound semiconductor layer 21, a first main electrode 3 which is connected to one end of the two-dimensional carrier gas channel 24, and a second main electrode 4 which is connected to the other end of the two-dimensional carrier gas channel 24 and which is separated from the first end, are arranged. The dopant concentration of the second compound semiconductor layer 22 (2) is different in the direction of the two-dimensional carrier gas channel 24 between the first main electrode 3 and the second main electrode 4. In the twelfth embodiment, the first main electrode 3 is used as a cathode electrode with an ohmic connection to the two-dimensional carrier gas channel 24 and the second main electrode 4 is used an anode with a Schottky connection to the two-dimensional carrier gas channel 24.

Here, the compound semiconductor functional layer 2 is a nitride based semiconductor functional layer the same as the compound semiconductor functional layer 2 of the HEMT 1 related to the seventh embodiment stated above. Between the first main electrode 3 and the second main electrode 4 of the second compound semiconductor layer 22 (2), the dopant concentration of the first main electrode 3 (anode electrode) side is set higher than the dopant concentration of the second main electrode 4 (cathode electrode) side.

In the SBD 11 an electrical field tends to concentrate at the second main electrode 4 (cathode electrode) side which becomes a Schottky connection. Therefore, the same as the HEMT 1 related to the seventh embodiment stated above, by setting the dopant concentration low at the second main electrode 4 side of the second compound semiconductor layer 22 (2) in the SBD 11, it is possible to reduce the carrier density near the second main electrode 4 of the two-dimensional carrier gas channel 24 and also reduce the electrical field strength E.

Furthermore, the stacked structure or the material of the compound semiconductor functional layer 2 of the SBD 11 related to the twelfth embodiment may be changed to the stacked structure or material of the compound semiconductor functional layer 2 of any of the HEMTs 1 related to the first to fourth transformation examples of the seventh embodiment stated above.

Characteristics of the Twelfth Embodiment

As was explained above, in the SBD 11 related to the twelfth embodiment, it is possible to modulate the carrier density of the two-dimensional carrier gas channel 24 which is produced in the compound semiconductor functional layer 2 and electrical field strength E in the travel direction of the carriers. As a result, in the SBD 11, because it is possible to lower the electrical field strength E near the second main electrode 4, it is possible to improve breakdown resistivity.

Transformation Example

Figure 27:
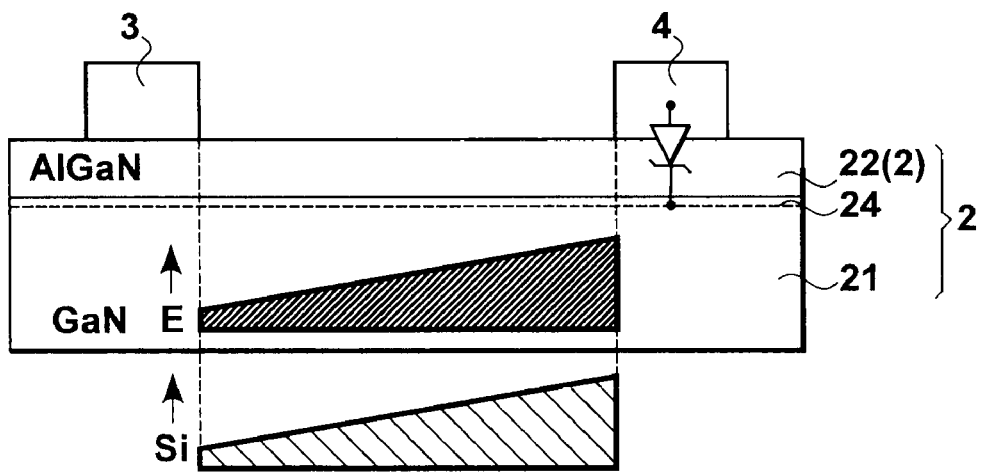
FIG. 27 is an exemplary cross sectional view for explaining the state of an electric field distribution and a dopant density profile of a semiconductor device related to a transformed example of the twelfth embodiment of the present invention.

The basic structure of the SBD 11 related to the transformation example of the twelfth embodiment shown in FIG. 27 is the same as the SBD 11 shown in FIG. 26, however, the dopant concentration at the first main electrode 3 side of the second compound semiconductor layer 22 (2) is set low, and set high at the second main electrode 4 side of the second compound semiconductor layer 22 (2).

In the SBD 11 related to the transformation example formed in this way, as was explained in the HEMT 1 related to the eighth embodiment stated above, it is possible to modulate the carrier density of the two-dimensional carrier gas channel 24 which is produced in the compound semiconductor functional layer 2 and electrical field strength E in the travel direction of the carriers. As a result, in the SBD 11, it is possible to increase the electrical field strength E near the second main electrode 4 and because it is possible to increase the speed of the carriers of the two-dimensional carrier gas channel 24 it is possible to achieve an increase in switching speed.

Furthermore, in the SBD 11 related to the twelfth embodiment and its transformation example, the dopant concentration of the second compound semiconductor layer 22 (2) may be continuously changed in the direction of the two-dimensional carrier gas channel 24, however, the same as the HEMT 1 related to the eleventh embodiment, the dopant concentration of the second compound semiconductor layer 22 (2) may be changed in steps in the direction of the two-dimensional carrier gas channel. In addition, in the SBD 11 related to the twelfth embodiment and its transformation example, the stacked structure or material of the second compound semiconductor layer 22 (2) may be changed to the same as any of the HEMTs 1 related to the first to fourth transformation examples of the seventh embodiment.

According to the present invention, it is possible to provide a semiconductor device in which the carrier density of a two-dimensional carrier gas channel produced in a compound semiconductor functional layer and electrical field can be modulated in the travel direction of the carriers by changing the compound ratio of an elemental compound between main electrodes of a barrier layer.

In addition, according to the present invention, it is possible to provide a semiconductor device in which the carrier density of a two-dimensional carrier gas channel produced in a compound semiconductor functional layer and electrical field can be modulated in the travel direction of the carriers by changing a dopant concentration between main electrodes of a barrier layer.

Other Embodiments

As stated above, the present invention is described by a plurality of embodiments. However, the descriptions and diagram which form one part of this disclosure are not limited to this invention. The present invention can be applied to various alternative embodiments, examples and specialist technologies.

For example, in the present invention, the bottom surface of at least one of the first main electrode 3, the second main electrode 4 or gate electrode 5 may be engraved up to the first compound semiconductor layer 21. In addition, in the present invention, the gate electrode 5 may be engraved to have a known recess gate structure.

Furthermore, the present invention is not limited to a single layer structure or multi-layer structure and the compound ratio of Al may be changed in the thickness direction of the second compound semiconductor layer 22 (1). For example, in the second compound semiconductor layer 22 (1), the compound ratio x2 of Al at the first main electrode 3 side may be set to a region which is low and a region which is high in the thickness direction, and the compound ratio x3 of Al of the second main electrode 4 side may be set to only the low region.

Furthermore, in the present invention, the compound ratio of an elemental compound of the second compound semiconductor layer 22 (1) may be changed in two steps or four steps in the direction of the two-dimensional carrier gas channel 24.

Furthermore, in the present invention, the second compound semiconductor layer 22 (1) having a dopant may be stacked above the first compound semiconductor layer 21 via an undoped (i type) compound semiconductor layer. In addition, in the present invention, the second compound semiconductor layer 22 (1) may be stacked above the first compound semiconductor layer 21 via a spacer layer. An AlN layer may be used, for example, for the spacer layer.

Furthermore, in the present invention, a cap layer which reduces the surface level of the carriers formed by a layer of GaN, for example, may be arranged between the first main electrode 3, second main electrode 4 and the second compound semiconductor layer 22 (1).

Furthermore, in the present invention, the thickness of the second compound semiconductor layer 22 (1) may be increased from the end part of the opposite side to the second main electrode 3 and first main electrode 3 towards the end part of the second compound semiconductor layer 22 (1).

Furthermore, in the present invention is not limited to a single layer structure or a multi-layer structure and the dopant concentration may be changed in the direction of the second compound semiconductor layer 22 (2).

Furthermore, in the present invention, the dopant concentration of the second compound semiconductor layer 22 (2) may be changed in two steps or four steps in the direction of the two-dimensional carrier gas channel 24.

What is claimed is:

1. A semiconductor device comprising:
   a compound semiconductor layer including a first semiconductor layer and a second semiconductor layer forming a hetero junction with the first semiconductor layer so as to generate a two-dimensional carrier gas channel in the first semiconductor layer along the hetero junction and make the second semiconductor layer be a barrier layer;
   a first main electrode connected to a first end of the second semiconductor layer;
   a second main electrode connected to a second end of the second semiconductor layer; and
   a dopant of an n type or a p type doped in the second semiconductor layer, the dopant having a concentration gradient from the first end to the second end.

2. The semiconductor device according to claim 1, wherein the concentration gradient is continuously descending or ascending.

3. The semiconductor device according to claim 1, wherein the concentration gradient is stepwise descending or ascending.

4. The semiconductor device according to claim 1, wherein the first compound semiconductor layer is an n type doped nitride based semiconductor layer having n type dopants, the second compound semiconductor layer is a nitride based semiconductor layer, and the two-dimensional carrier gas channel is a two-dimensional electron gas channel.

5. The semiconductor device according to claim 1, wherein one or both of an undoped layer and a spacer layer is arranged between the first compound semiconductor layer and the second compound semiconductor layer.

6. The semiconductor device according to claim 1, wherein the first main electrode is a source electrode connected to the first end, the second main electrode is a drain electrode connected to the second end;
   and further comprising;
   a gate electrode arranged between the source electrode and the drain electrode above the two-dimensional carrier gas channel; and
   wherein the dopant concentration between the source electrode and the gate electrode of the second semiconductor layer is higher than the dopant concentration between the drain electrode and the gate electrode of the second semiconductor layer.

7. The semiconductor device according to claim 1, wherein the first main electrode is a source electrode connected to the first end, the second main electrode is a drain electrode connected to the second end;
   and further comprising;
   a gate electrode arranged between the source electrode and the drain electrode above the two-dimensional carrier gas channel; and
   wherein the dopant concentration between the drain electrode and the gate electrode of the second semiconductor layer is higher than the dopant concentration between the source electrode and the gate electrode of the second semiconductor layer.

8. The semiconductor device according to claim 1, wherein the second main electrode is an anode electrode with a Schottky connection to one end of the two-dimensional carrier gas channel; and the first main electrode is a cathode electrode with an ohmic connection to another end of the two-dimensional carrier gas channel, these ends being separated;

wherein a dopant concentration of the anode electrode side being lower than a dopant concentration of the cathode electrode side between the anode electrode and the cathode electrode of the second compound semiconductor layer.

9. The semiconductor device according to claim 1, wherein the second main electrode is an anode electrode with a Schottky connection to one end of the two-dimensional carrier gas channel; and the first main electrode is a cathode electrode with an ohmic connection to another end of the two-dimensional carrier gas channel, these ends being separated;

wherein a dopant concentration of the anode electrode side being higher than a dopant concentration of the cathode electrode side between the anode electrode and the cathode electrode of the second compound semiconductor layer.

* * * * *